US008116368B2

(12) United States Patent
Yoneya

(10) Patent No.: US 8,116,368 B2
(45) Date of Patent: Feb. 14, 2012

(54) PWM SIGNAL GENERATOR, PWM SIGNAL GENERATING DEVICE, AND DIGITAL AMPLIFIER

(75) Inventor: Akihiko Yoneya, Toyota (JP)

(73) Assignee: National University Corporation Nagoya Institute of Technology, Nagoya-shi (JP)

( * ) Notice: Subject to any disclaimer, the term of this patent is extended or adjusted under 35 U.S.C. 154(b) by 528 days.

(21) Appl. No.: 12/309,630

(22) PCT Filed: Jul. 27, 2006

(86) PCT No.: PCT/JP2006/314917
§ 371 (c)(1),
(2), (4) Date: Jan. 26, 2009

(87) PCT Pub. No.: WO2008/012904
PCT Pub. Date: Jan. 31, 2008

(65) Prior Publication Data
US 2009/0190651 A1    Jul. 30, 2009

(51) Int. Cl.
*H03K 7/08* (2006.01)
(52) U.S. Cl. ........................................ 375/238
(58) Field of Classification Search .............. 375/238, 375/241, 242
See application file for complete search history.

(56) References Cited

U.S. PATENT DOCUMENTS

| 2004/0212524 A1* | 10/2004 | Komarura | 341/143 |
| 2005/0046601 A1* | 3/2005 | Alrutz et al. | 341/53 |
| 2005/0110667 A1* | 5/2005 | Borisavljevic | 341/152 |

FOREIGN PATENT DOCUMENTS

| JP | A-5-63457 | 3/1993 |
| JP | A-11-266579 | 9/1999 |
| JP | A-2003-264465 | 9/2003 |
| JP | A-2005-236928 | 9/2005 |
| JP | A-2006-54800 | 2/2006 |
| JP | A-2006-54815 | 2/2006 |
| JP | A-2006-101112 | 4/2006 |

OTHER PUBLICATIONS

Akihiko Yoneya, "Noise Shaping Filter Compensating PWM Distortion for Fully Digital Amplifier," The Transactions of the Institute of Electrical Engineers of Japan C IEEJ Transactions on Electronics, Dec. 1, 2005, pp. 1818-1823, vol. 125, No. 12.

* cited by examiner

*Primary Examiner* — David B. Lugo
(74) *Attorney, Agent, or Firm* — Oliff & Berridge, PLC

(57) ABSTRACT

In a full digital amplifier for an audio amplifier or the like, it is possible to suppress the concentration of an electromagnetic noise emission spectrum at a specific frequency. A sampling period variation type digital filter is realized by varying the coefficient of a noise shaping filter for the delta-sigma modulator of the full digital amplifier depending on a sampling period. This allows the variation in the carrier frequency of the pulse width modulation.

12 Claims, 13 Drawing Sheets

PWM SIGNAL GENERATOR, PWM SIGNAL GENERATING DEVICE, AND DIGITAL AMPLIFIER

TECHNICAL FIELD

The present invention relates to a PWM signal generator and a PWM signal generation device which modulate the pulse width of a digital signal, and a digital amplifier that utilizes the generator and the generation device.

BACKGROUND ART

Digital amplifiers using switching amplifiers (class-D amplifiers) have been used as audio amplifiers that drive speakers or the like, owing to, for example, the high power efficiency of the digital amplifiers. The digital amplifiers are classified as a type to which analog signals are input or a type to which digital signals are input; digital amplifiers of the latter type are called fully digital amplifiers. The fully digital amplifier can generate output signals without the need for analog input signals. The fully digital amplifier thus has advantages of enabling cost reduction of an audio system and improving performance of the audio system while maintaining high energy efficiency.

Operation of a common fully digital amplifier will be described below. An example of a configuration of the fully digital amplifier is shown in FIG. 2. A sound source signal r[i] is a pulse code modulated (PCM) signal. If the sound source signal is obtained from, for example, a CD, the sound source signal r[i] has a sampling frequency of 44.1 kHz. The sound source signal r[i] is input to an over sampler 4, which then converts the sound source signal r[i] into a PCM signal u[k] of 705.6 kHz, which is 16 times as high as the sampling frequency of the sound source signal r[i]. The PCM signal u[k] is then converted, by a quantizer 1, into a PCM signal y[k] having the same sampling period but coarsely quantized. The resolution of the PCM signal y[k] is determined by the quantizer 1 and is the same as that of a pulse width modulator 2. The PCM signal y[k] is converted into a pulse width modulated (PWM) signal w(t) by the pulse width modulator 2. A noise-shaping filter 3, compensates for quantization noise generated by the quantizer 1 and signal distortion generated by the pulse width modulator 2 by feedback, so that an audible frequency component of the PWM signal w(t) corresponds to an audible frequency component of the PCM signal u[k]. Thus, the audible frequency component of the PWM signal w(t) corresponds to the sound source signal r[i]. The PWM signal w(t) is supplied to a switching amplifier 5, which then converts the PWM signal w(t) into a power signal. The power signal then passes through a low-pass filter 6 composed of L and C, and is supplied to a speaker that is a load.

Patent Document 1 discloses a low-distortion pulse width modulation signal generator which allows the signal distortion resulting from the pulse width modulation to be fed back to the noise-shaping filter to reduce harmonic distortion, the low-distortion pulse width modulation signal generator superposing a feed forward signal for compensation of the harmonic distortion on an input to the quantizer.

Patent Document 1: Japanese Patent Laid-Open No. 2004-236617

DISCLOSURE OF THE INVENTION

Problems to be Solved by the Invention

However, with the conventional fully digital amplifier, since the switching amplifier is driven by the PWM signal generated by digital circuits, a fixed carrier frequency in the pulse width modulation may cause radiation of electromagnetic noise with a high peak at a frequency that is an integral multiple of the carrier frequency.

FIGS. 24 and 25 show an example of a spectrum of the PWM signal generated by the conventional fully digital amplifier. The method described in Patent Document 3 was used to generate the PWM signal. An input signal is a pulse code modulated (PCM) signal with a sampling frequency of 44.1 kHz which is a sinusoidal wave exhibiting a modulation factor of 82% with a frequency of 2.7563 kHz. A 31-level symmetric pulse width modulator was used for the pulse width modulation and exhibited a carrier frequency of 705.6 kHz. As shown in FIG. 24, possible quantization noise in an audible frequency region is appropriately suppressed. However, as shown in FIG. 25, a high peak of the spectrum is generated at frequencies that are equal to every integral multiple of the carrier frequency. If these peaks leak owing to electromagnetic radiation or the like, AM radios, for example, are electromagnetically interfered.

To mitigate the adverse effect of electromagnetic noise in an internal operation signal and harmonic frequencies thereof, a known method dynamically varies a clock frequency to spread the spectrum of the electromagnetic noise. However, the PWM carrier frequency of the pulse width modulator 2 needs to be dynamically varied in order to apply the method of spreading the spectrum, to the fully digital amplifier. To achieve this, the sampling period of the noise-shaping filter 3, which is a digital filter, needs to be dynamically varied. However, no noise-shaping filter has been proposed which maintains desired characteristics even with a dynamic variation in sampling period. Thus, disadvantageously, the spectrum spreading technique has been unable to be used for the fully digital amplifier.

Thus, the present invention solves these problems. An object of the present invention is to provide a PWM signal generator and a PWM signal generation device which maintain the desired characteristics while dynamically varying the carrier frequency of the pulse width modulation, to spread the spectrum of the PWM signal, thus enabling possible electromagnetic noise to be effectively prevented, as well as to provide a digital amplifier utilizing the generator and the generation device.

Means for Solving the Problems

A method of varying coefficients for calculations in a noise-shaping filter depending on a sampling period is used as means for realizing a noise-shaping filter that maintains desired characteristics even with a variation in sampling period. In this case, it is necessary not only to vary the coefficient but also to take the configuration of the noise-shaping filter into account. Furthermore, a design method for the noise-shaping filter varies depending on, for example, a relationship between the sampling period of an input signal and the sampling period of an output signal.

Thus, the first aspect of the present invention provides a PWM signal generator to which a first PCM signal is input and which outputs a PWM signal, the PWM signal generator being characterized in that a low frequency component of the PWM signal depends on a low frequency component of the first PCM signal, the first PCM signal has a first sampling period, and the PWM signal is generated by digital means based on a second PCM signal with a second sampling period, in that the second sampling period is varied for each sampling period so that the same period may consecutively appear, according to an external instruction or a predetermined sequence, the first sampling period is equal to the second sampling period, and a resolution of the second PCM signal is coarser than that of the first PCM signal, in that the first PCM signal is converted into the second PCM signal by a delta-sigma modulator, the delta-sigma modulator includes a filter and a quantizer, and the first PCM signal and the second PCM signal are input to the filter, which then outputs a third PCM signal, and in that the third PCM signal is converted into the second PCM signal through the quantizer, a gain of the quantizer is dynamically varied in proportion to a value of the second sampling period, and a set of coefficients and a set of functions for an internal calculation in the filter are determined and dynamically varied according to the second sampling period.

The second aspect of the present invention provides a PWM signal generator to which a first PCM signal is input and which outputs a PWM signal, the PWM signal generator being characterized in that a low frequency component of the PWM signal depends on a low frequency component of the first PCM signal, the first PCM signal has a first sampling period, and the PWM signal is generated by digital means based on a second PCM signal with a second sampling period, in that the second sampling period is varied for each sampling period so that the same period may consecutively appear, according to an external instruction or a predetermined sequence, a timing for sampling of the first PCM signal is obtained by adding a timing between samplings of the second PCM signal to a timing for sampling of the second PCM signal, and a resolution of the second PCM signal is coarser than that of the first PCM signal, in that the first PCM signal is converted into the second PCM signal by a delta-sigma modulator, the delta-sigma modulator includes a filter and a quantizer, and the first PCM signal and the second PCM signal are input to the filter, which then outputs a third PCM signal, and in that the third PCM signal is converted into the second PCM signal through the quantizer, a gain of the quantizer is dynamically varied in proportion to a value of the second sampling period, and a set of coefficients and a set of functions for an internal calculation in the filter are determined and dynamically varied according to the second sampling period.

The third aspect of the present invention provides a PWM signal generator to which a first PCM signal is input and which outputs a PWM signal, the PWM signal generator being characterized in that a low frequency component of the PWM signal depends on a low frequency component of the first PCM signal, the first PCM signal has a first sampling period which is constant, and the PWM signal is generated by digital means based on a second PCM signal with a second sampling period, in that the second sampling period is varied for each sampling period so that the same period may consecutively appear, according to an external instruction or a predetermined sequence, and the first PCM signal is converted into the second PCM signal by a delta-sigma modulator, in that the delta-sigma modulator includes a filter and a quantizer, and the first PCM signal and the second PCM signal are input to the filter, which then outputs a third PCM signal, and in that the third PCM signal is converted into the second PCM signal through the quantizer, a gain of the quantizer is dynamically varied in proportion to a value of the second sampling period, and a set of coefficients and a set of functions for an internal calculation in the filter are determined and dynamically varied according to the second sampling period, or the second sampling period and a relative relationship between a timing for sampling of the first PCM signal and a timing for sampling of the second PCM signal.

The fourth aspect of the present invention provides a PWM signal generation device including the PWM signal generator according to the first to third inventions and to which a fourth PCM signal is input, the PWM signal generation device outputting the PWM signal, the PWM signal generation device being characterized in that a low frequency component of the PWM signal depends on the fourth PCM signal, and the fourth PCM signal has a third sampling period which is constant, and in that the PWM signal generation device includes an over sampler to which the fourth PCM signal is input and which outputs the first PCM signal, and the third sampling period is longer than the first sampling period.

The fifth aspect of the present invention provides a digital amplifier characterized by comprising a switching amplifier driven by a PWM signal generated by the PWM signal generation device according to the fourth invention.

ADVANTAGE OF THE INVENTION

According to the present invention, a carrier frequency for pulse width modulation is dynamically varied to spread the spectrum of the PWM signal to effectively prevent electromagnetic noise, while minimizing signal distortion to allow maintenance of the desired performance of the PWM signal generator and the digital amplifier utilizing the PWM signal generator.

BEST MODE FOR CARRYING OUT THE INVENTION

First Embodiment

In a case described below, a sampling period of a PCM signal u[k] is the same as that of a PCM signal y[k], and this sampling period varies. The configuration of a fully digital amplifier in this case is the same as that shown in FIG. 2. The configuration of the noise-shaping filter is as shown in FIG. 1.

First, to determine target frequency characteristics of the noise-shaping filter, the noise-shaping filter in continuous-time is designed and expressed with a state variable vector as shown in:

$$x^*(t)=A^*x^*(t)+b^*(u^*(t)-w(t))$$

$$v^*(t)=c^*x^*(t) \quad \text{[Equation 1]}$$

In Equation 1, $u^*(t)$ is a continuous time signal corresponding to the PCM signal u[k], w(t) is a PWM signal generated by a pulse width modulator, $v^*(t)$ is a continuous time signal corresponding to a compensation signal v[k] generated by the noise-shaping filter, and $x^*(t)$ is a state variable vector. The continuous time filter is discretized in time at a sampling period $\tau_k$ using a 0th-order hold. However, since the sampling period $\tau_k$ varies dynamically, between samplings, an input signal $u^*(t)$ is represented by the value of a time intermediate between the sampling points. This is shown in FIG. 3. However, the compensation signal v[k] samples the value at a sampling time. That is, Equations 2 and 3 hold true.

$$u[k]=u^*((t_k+t_{k-1})/2) \quad \text{(Equation 2)}$$

$$v[k]=v^*(t_k) \quad \text{(Equation 3)}$$

In these Equations, $t_k$ is the kth sampling time. Then, a digital filter shown in Equations 4 and 5 is obtained.

$$x[k+1]=A(\tau_k)x[k]+b(\tau_k)u[k]-e(y[k])$$

$$v[k]=cx[k] \quad \text{[Equation 4]}$$

$$A(\tau_k) = \exp(A^* \tau_k) \quad \text{[Equation 5]}$$

$$b(\tau_k) = \int_0^{\tau_k} \exp(A^* t)\, dt\, b^*$$

$$c = c^*$$

$$e(y[k]) = \int_0^{\tau_k} \exp(A^*(\tau_k - t)) b^* w(t_k + t)\, dt$$

In this case, the state variable vector x[k] for the digital filter corresponds to the sampled value of the state variable x*(t) for the continuous time filter. That is, $x[k]=x(t_k)$, $t_{k+1}-t_k=\tau_k$. Thus, even when the sampling period $\tau_k$ varies for each sampling, a discrete time filter is ensured to be stable and to offer output/input transfer characteristic similar to those of the continuous time filter.

Now, it is assumed that an nth-order filter is designed. In this case, $A(\tau_k)$ in Equation 4 is an n×n matrix. Consequently, the amount of digital filter calculations increases consistently with the number of coefficients for the digital filter. Thus, when the continuous time filter in Equation 1 is designed, a matrix A* is block-diagonalized. Then, a matrix $A(\tau_k)$ in Equation 4 is also block-diagonalized, enabling a reduction in the number of nonzero coefficients for the digital filter and thus the amount of digital filter calculations. Moreover, in addition to block-diagonilizing the matrix A*, each of the elements of an output vector c from the continuous time filter in Equation 1 is set to be 1 or 0, thus enabling a further reduction in the amount of digital filter calculations. This is because the output vector is prevented from being varied by the discretization in time in Equation 2.

For the above-described discrete time filter, the 0th-order hold is assumed for the input signal to set the value of the signal between sample points to be constant. Thus, a variation in sampling period may distort the signal owing to this assumption. A possible method for dealing with the signal distortion is to interpolate the value of the input signal between the sample points. Several possible methods can be used for the interpolation.

First, the signal waveform of the input signal between the sample points is assumed to be approximated using straight lines. This is shown in FIG. 4. Compared to the use of the 0th-order hold, the 1st-order approximation is expected to reduce the signal distortion caused by a variation in sampling period. A hold element used to approximate responses between the sample points with straight lines is called a triangular hold. The triangular hold is used to interpolate the continuous time signal u*(t) to discretize the continuous time filter expressed by Equation 1, in relation to time. Then, the filter is as shown in Equations 6 and 7. In this case, the compensation signal v[k] is represented by the value of the continuous time signal v*(t) at a sample time.

$$x[k+1]=A(\tau_k)x[k]+b_1(\tau_k)u[k]+b_2(\tau_k)u[k+1]-e(y[k])$$

$$v[k]=cx[k] \quad \text{[Equation 6]}$$

$$A(\tau_k) = \exp(A^* \tau_k) \quad \text{[Equation 7]}$$

$$b_1(\tau_k) = \int_0^{\tau_k} \frac{t}{\tau_k} \exp(A^* t)\, dt\, b^*$$

$$b_2(\tau_k) = \int_0^{\tau_k} \left(1 - \frac{t}{\tau_k}\right) \exp(A^* t)\, dt\, b^*$$

$$c = c^*$$

-continued $$e(y[k]) = \int_0^{\tau_k} \exp(A^*(\tau_k - t)) b^* w(t_k + t)\, dt$$

The digital filter is not strictly proper but includes a feedthrough term from the input to the output.

Now, the signal waveform of the input signal between the sample points is assumed to be approximated with 2nd-order polynomial curves. This is shown in FIG. 5. Compared to the 1st-order approximation, the 2nd-order approximation is expected to reduce the signal distortion caused by a variation in sampling period. Here, the value of u*(t) at $t_k \leq t \leq t_k+2$ is subjected to 2nd-order approximation using the values of $u(t_k)$, $u(t_{k+1})$ and $u(t_{k+2})$. The value of k is odd. Then, the u*(t) subjected to the 2nd-order approximation is as shown in Equations 8 and 9.

$$u^*(t) = u[k] + (p_0 u[k] + p_1 u[k+1] + p_2 u[k+2])t + \quad \text{[Equation 8]}$$
$$(q_0 u[k] + q_1 u[k+1] + q_2 u[k+2])t^2$$

$$p_0 = -\frac{2\tau_k + \tau_{k+1}}{\tau_k(\tau_k + \tau_{k+1})}, \quad \text{[Equation 9]}$$

$$p_1 = \frac{\tau_k + \tau_{k+1}}{\tau_k \tau_{k+1}},$$

$$p_2 = -\frac{\tau_k}{\tau_{k+1}(\tau_k + \tau_{k+1})}$$

$$q_0 = \frac{1}{\tau_k(\tau_k + \tau_{k+1})},$$

$$q_1 = -\frac{1}{\tau_k \tau_{k+1}},$$

$$q_2 = \frac{1}{\tau_{k+1}(\tau_k + \tau_{k+1})}$$

The interpolated time function is used to discretize the continuous time filter expressed by Equation 1, in relation to time. Then, the filter is as shown in Equations 10 to 13. The compensation signal v[k] is represented by the value of the continuous time signal v*(t) at the sample time.

$$x[k+1]=A(\tau_k)x[k]+b_0^o u[k]+b_1^o u[k+1]+b_2^o u[k+2]-e(y[k])$$

$$v[k]=cx[k] \quad \text{[Equation 10]}$$

$$A(\tau_k) = \exp(A^* \tau_k) \quad \text{[Equation 11]}$$

$$b_0^o = \int_0^{\tau_k} (1 + p_0 t + q_0 t^2) \exp(A^*(\tau_k - t))\, dt\, b^*$$

$$b_1^o = \int_0^{\tau_k} (p_1 t + q_1 t^2) \exp(A^*(\tau_k - t))\, dt\, b^*$$

$$b_2^o = \int_0^{\tau_k} (p_2 t + q_2 t^2) \exp(A^*(\tau_k - t))\, dt\, b^*$$

$$c = c^*$$

$$e(y[k]) = \int_0^{\tau_k} \exp(A^*(\tau_k - t)) b^* w(t_k + t)\, dt$$

$$x[k+2]=A(\tau_{k+1})x[k+1]+b_0^e u[k]+b_1^e u[k+1]+b_2^e u[k+2]-e(y[k+1])$$

$$v[k+1]=cx[k+1] \quad \text{[Equation 12]}$$

$$A(\tau_{k+1}) = \exp(A^*\tau_{k+1}) \quad \text{[Equation 13]}$$

$$b_0^c = \int_{\tau_k}^{\tau_k + \tau_{k+1}} (1 + p_0 t + q_0 t^2)\exp(A^*(\tau_k + \tau_{k+1} - t))\,dt\, b^*$$

$$b_1^c = \int_{\tau_k}^{\tau_k + \tau_{k+1}} (p_1 t + q_1 t^2)\exp(A^*(\tau_k + \tau_{k+1} - t))\,dt\, b^*$$

$$b_2^c = \int_{\tau_k}^{\tau_k + \tau_{k+1}} (p_2 t + q_2 t^2)\exp(A^*(\tau_k + \tau_{k+1} - t))\,dt\, b^*$$

$$c = c^*$$

$$e(y[k+1]) = \int_{\tau_k}^{\tau_k + \tau_{k+1}} \exp(A^*(\tau_k + \tau_{k+1} - t))\, b^* w(\tau_k + t)\,dt$$

The continuous time signal $u^*(t)$ is interpolated and approximated using the values of the PCM signal $u[k]$ at three consecutive sampling times. Thus, the filter calculation at an odd number sample time is different from that at an even number sample time. Furthermore, causality does not hold true for the digital filter. Consequently, the digital filter can be used only if the input signal can be foreseen one sample earlier or if the output signal can be delayed one sample.

Second Embodiment

An alternative method is assumed in which the continuous time signal $u^*(t)$ is subjected to 2nd-order interpolation such that the signal values between the sample points are interpolated using the values of the input signals at the sampling times and the value of the input signal at one point between the sampling times for the filter calculation. This is shown in FIG. 6. Compared to the above-described method, this method reduces the sample intervals for the input signal. This can be expected to reduce the signal distortion caused by a variation in sampling period.

It is assumed that the PCM signal $u[k]$ is the value of the $u^*(t)$ at each sampling time for a loop shaping filter and that the input signal between the sample points is newly sampled for every pair of the sampling points and then input. The time between the sample points when the signal is sampled is optional. Here, sampling is assumed to be performed at the time corresponding to the intermediate point between the sample points. The signal corresponding to the intermediate point is assumed to be $u_c[k]$. The value of $u^*(t)$ where $t_k \leq t \leq t_{k+1}$ can be subjected to 2nd-order approximation using the values of $u[k]$, $u[k+1]$, and $u_c[k]$, as shown in Equation 14.

$$u^*(t) = u[k] + (-3u[k] + 4u_c[k] - u[k+1])\frac{t}{\tau_k} + (2u[k] - 4u_c[k] + 2u[k+1])\frac{t^2}{\tau_k^2} \quad \text{[Equation 14]}$$

The interpolated time function is used to discretize the continuous time filter expressed by Equation 1, in relation to time. Then, the resulting filter is as shown in Equations 15 and 16. The compensation signal $v[k]$ is represented by the value of the continuous time signal $v^*(t)$ at the sample time.

$$x[k+1]=A(\tau_k)x[k]+b_0^c u[k]+b_1^c u_c[k]+b_2^c u[k+1]-e(y[k])$$

$$v[k]=cx[k] \quad \text{[Equation 15]}$$

$$A(\tau_k) = \exp(A^*\tau_k) \quad \text{[Equation 16]}$$

$$b_0^c = \int_0^{\tau_k} (1 - 3t + 2t^2)\exp(A^*(\tau_k - t))\,dt\, b^*$$

$$b_1^c = \int_0^{\tau_k} (4t - 4t^2)\exp(A^*(\tau_k - t))\,dt\, b^*$$

$$b_2^c = \int_0^{\tau_k} (-t + 2t^2)\exp(A^*(\tau_k - t))\,dt\, b^*$$

$$c = c^*$$

$$e(y[k]) = \int_0^{\tau_k} \exp(A^*(\tau_k - t))\, b^* w(t_k + t)\,dt$$

The digital filter is not strictly proper and includes a feedthrough term from the input to the output.

Third Embodiment

Now, it is assumed that the sampling period of the PCM signal $u[h]$ is constant, whereas the sampling period of the PCM signal $y[k]$ varies. The noise-shaping filter is operated in synchronism with the sampling of the PCM signal $y[k]$. The configuration of the fully digital amplifier in this case is shown in FIG. 7. The constant sampling period of the PCM signal $u[h]$ enables the signal distortion caused by a dynamic variation in sampling period of the noise-shaping filter to be minimized. Also in this case, the target dynamic characteristics of the noise-shaping filter are assumed to be provided by the continuous time filter expressed by Equation 1.

Sampling of the PCM signal $u[h]$ is assumed to take place at most once between the sample points of the PCM signal $y[k]$. The 0th-order hold is applied to the PCM signal $u[h]$. This is shown in FIG. 8. The output signal $v[k]$ is assumed to be represented by the value of the signal at the sample time. Such a digital filter is as shown in Equations 18, 19, 21, and 22. Here, the time when the input $u[h]$ is sampled is defined as $t^u_h$. The time when the output $y[k]$ is sampled is defined as $t_k$.

When (Equation 17) $t^u_h \leq t_k < t_{k+1} < t^u_{h+1}$, that is, when no input signal is sampled between output sample points, the resulting filter is as shown in Equations 18 and 19.

$$x[k+1]=A(\tau_k)x[k]+b(\tau_k)u[h]-e(y[k])$$

$$v[k]=cx[k] \quad \text{[Equation 18]}$$

$$A(\tau_k) = \exp(A^*\tau_k) \quad \text{[Equation 19]}$$

$$b(\tau_k) = \int_0^{\tau_k} \exp(A^*t)\,dt\, b^*$$

$$c = c^*$$

$$e(y[k]) = \int_0^{\tau_k} \exp(A^*(\tau_k - t))\, b^* w(t_k + t)\,dt$$

Furthermore, when $$t^u_h \leq t_k < t^u_{h+1} \leq t_{k+1} < t^u_{h+2} \quad \text{(Equation 20)}$$

that is, when the input signal is sampled once between the output sample points, the resulting filter is as shown in Equations 21 and 22.

$$x[k+1]=A(\tau_k)x[k]+b_3(\tau_k, t_{k+1}-t^u_{h+1})u[h]+b(t_{k+1}-t^u_{h+1})u[h+1]-e(y[k])$$

$$v[k]=cx[k] \quad \text{[Equation 21]}$$

$$A(\tau_k) = \exp(A^* \tau_k) \quad \text{[Equation 22]}$$

$$b(t_{k+1} - t^u_{h+1}) = \int_0^{t_{k+1} - t_{h+1}} \exp(A^* t) \, dt \, b^*$$

$$b_3(\tau_k, t_{k+1} - t^u_{h+1}) = \int_{t_{k+1} - t_{h+1}}^{\tau_k} \exp(A^* t) \, dt \, b^*$$

$$c = c^*$$

$$e(y[k]) = \int_0^{\tau_k} \exp(A^*(\tau_k - t)) b^* w(t_k + t) \, dt$$

It is assumed that for the addition of the u[h] to the v[k], the value of the u[h] corresponding to the time immediately before $t_k$ is added to the v[k]. The above-described method has applied the 0th-order hold to the PCM signal u[h]. However, the noise-shaping filter can be similarly designed even if the triangular hold or any other interpolation method is used.

It is assumed that calculations for the noise-shaping filter are performed according to the sampling period of the PCM signal u[h]. The PCM signal y[k] has a dynamically varying sampling period and thus does not always synchronize with the calculation period of the noise-shaping filter. The 0th-order hold is used for the PCM signal u[h] to discretize the continuous time filter expressed by Equation 1, in relation to time. In this discretization, using the PWM signal w(t) as the feedback signal increases the size of a table required for the calculations for the noise-shaping filter. Thus, the PWM signal w(t) is approximated by the PCM signal y[k].

Here, the desired noise-shaping filter is as follows. When $\tau^u = t^u_{h+1} - t^u_h$, the desired noise-shaping filter is as shown in Equations 24, 26, and 27.

If $$t_{k-1} \leq t^u_h \leq t_k < t^u_{h+1} < t_{k+1} \quad \text{(Equation 23)}$$

the resulting filter is as shown in Equation 24.

$$x[h+1] = A(\tau^u)x[k] + b(\tau^u)u[h] - b_3(\tau^u, t_{h+1}^u - t_k)y[k-1] - b(t_{h+1}^u - t_k)y[k]$$

$$v[k] = c_1(t_k - t_h^u)x[h] + d_3(t_k - t_h^u)(u[h] - y[k-1]) \quad \text{[Equation 24]}$$

If $$t_{k-1} \leq t^u_h \leq t_k < t_{k+1} < t^u_{h+1} \quad \text{(Equation 25)}$$

the resulting filter is as shown in Equations 26 and 27.

$$x[h+1] = A(\tau^u)x[k] + b(\tau^u)u[h] - b_3(\tau^u, t_{h+1}^u - t_k)$$
$$y[k-1] - b_3(t_{h+1}^u - t_k, t_{h+1}^u - t_{k+1})y[k] -$$
$$b(t_{h+1}^u - t_{k+1})y[k]$$
$$v[k] = c_1(t_k - t_h^u)x[h] + d_3(t_k - t_h^u)(u[h] - y[k-1])$$
$$v[k+1] = c_1(t_{k+1} - t_h^u)x[h] + d_3(t_{k+1} - t_k)(u[h] - y[k]) +$$
$$d_4(t_{k+1} - t_h^u, t_{k+1} - t_k)(u[h] - y[k-1]) \quad \text{[Equation 26]}$$

$$A(\tau^u) = \exp(A^* \tau^u) \quad \text{[Equation 27]}$$

$$b(\tau^u) = \int_0^{\tau^u} \exp(A^* t) \, dt \, b^*$$

$$b_3(\tau^u, t_{h+1}^u - t_k) = \int_{t_{h+1}^u - t_k}^{\tau^u} \exp(A^* t) \, dt \, b^*$$

$$c_1(t_k - t_h^u) = c^* \exp\{A^* \cdot (t_k - t_h^u)\}$$

$$d_3(t_{k+1} - t_h^u) = c^* \int_0^{t_{k+1} - t_h^u} \exp(A^* t) \, dt \, b^*$$

$$d_4(t_{k+1} - t_h^u, t_{k+1} - t_k) = c^* \int_{t_{k+1} - t_k}^{t_{k+1} - t_h^u} \exp(A^* t) \, dt \, b^*$$

It is assumed that in the addition of the u[h] to the v[k], the value of the u[h] corresponding to the time immediately before the $t_k$ is added to the v[k]. The above-described method has been assumed to use the 0th-order hold for the input. However, the digital filter can be similarly designed if the use of the hold is avoided or if the triangular hold is used.

First Example

The present example corresponds to a fully digital audio amplifier that uses a PWM signal with a dynamically varying carrier period. The configuration of the audio amplifier is as shown in FIGS. 1 and 2. A sound source signal r[i] is a PCM signal with a sampling frequency of 44.1 kHz and is input to an over sampler 4. The over sampler 4 converts the sound source signal r[i] into the PCM signal u[k] with the sampling interval $\tau_k$. The value of the sampling interval $\tau_k$ is not constant and is 1/16 (about 1.472 μs) or 15/64 (about 1.329 μs) of that of the sound source signal r[i]. The percentage at which the sampling interval $\tau_k$ of the PCM signal u[k] exhibits the 1/16 value is almost the same as that at which the sampling interval $\tau_k$ of the PCM signal u[k] exhibits the 15/64 value. Which of the values the sampling interval $\tau_k$ of the PCM signal u[k] exhibits is determined by a pseudo-random number. The noise-shaping filter 3 uses the 0th-order interpolation to perform the filter calculations shown in Equations 4 and 5. The frequency shaping of quantization noise in the PCM signal y[k], which is the output signal from the quantizer 1, is thus performed to suppress audible frequency components of the noise. The number of quantization steps in the quantizer 1 is 31 when the sampling interval $\tau_k$ is 1/16 of that of the sound source signal r[i] or 29 when the sampling interval $\tau_k$ is 15/64 of that of the sound source signal r[i].

The quantizer 1 associates the signal range (full scale) of the input signal with the signal range (full scale) of the output signal. The signal range of the input signal is constant, whereas the signal range of the output signal varies depending on the sampling interval $\tau_k$. Thus, a conversion gain of the quantizer 1 needs to be in proportion to the sampling interval $\tau_k$. This is expressed by y[k]=round (g*s[k]*$\tau_k$). Here, g is an appropriate constant, and s[k] is the input signal to the quantizer 1. Furthermore, round( ) is a function having an argument that performs a conversion into an integer closest to the argument.

The pulse width modulator 2 generates the PWM signal according to the PCM signal y[k]. In this case, the period of the carrier signal is equal to the sampling interval $\tau_k$ and varies dynamically. The generated PWM signal drives the switching amplifier 5. The switching amplifier 5 thus drives the speaker, which is a load, through the low-pass filter 6.

Several spectra of the PWM signal w(t) in the fully digital audio amplifier are shown in the figures. FIG. 9 shows an example of a spectrum of the PWM signal w(t) in the vicinity of the audible frequency region; the sound source signal is a sinusoidal wave with an amplitude of a modulation factor of 80% and a frequency of 2.7563 kHz. Although an insignificant second harmonic is observed, the spectrum shows that quantization noise in the audible frequency region is suppressed. However, compared to the case in which the sampling period of the u[k] is constant, the present example slightly raises a noise floor in the audible frequency region because of the adverse effect of an interpolation error in the signal u[k] in the noise-shaping filter. FIG. 10 shows a broad spectrum of the PWM signal w(t). The figure indicates that the spectrum is spread by the dynamic variation in the carrier frequency of the PWM signal. Although the total amount of spectrum does not change significantly, concentration of the spectrum at a particular frequency can be avoided. This allows electromagnetic noise to be prevented.

FIG. 11 shows a spectrum of the PWM signal w(t) in the vicinity of the audible frequency region; the sound source signal is a sinusoidal wave with an amplitude of a modulation factor of 80% and a frequency of 16.5378 kHz. The spectrum shows that the increased frequency of the sound source signal increases the floor noise in the audible frequency region. This is due to the adverse effect of the interpolation error in the signal u[k] in the noise-shaping filter.

An advantage of the present example is that the use of the concept of the 0th-order interpolation for the calculations for the noise-shaping filter enables a reduction in the amount of calculations.

Second Example

The present example corresponds to a fully digital audio amplifier that uses a PWM signal with a dynamically varying carrier period. The configuration of the audio amplifier is as shown in FIG. 2. The sound source signal r[i] is a PCM signal with a sampling frequency of 44.1 kHz and is input to the over sampler 4. The over sampler 4 converts the sound source signal r[i] into the PCM signal u[k] with the sampling interval $\tau_k$. The value of the sampling interval $\tau_k$ is not constant and is $1/16$ (about 1.472 μs) or $15/64$ (about 1.329 μs) of that of the sound source signal r[i]. The percentage at which the sampling interval $\tau_k$ of the PCM signal u[k] exhibits the $1/16$ value is almost the same as that at which the sampling interval $\tau_k$ of the PCM signal u[k] exhibits the $15/64$ value. Which of the values the sampling interval $\tau_k$ of the PCM signal u[k] exhibits is determined by a pseudo-random number. The noise-shaping filter 3 uses the 1st-order interpolation to perform the filter calculations shown in Equations 6 and 7. The spectrum of the quantization noise in the PCM signal y[k], which is the output signal from the quantizer 1, is thus shaped to suppress its audible frequency components. The number of quantization steps in the quantizer 1 is 31 when the sampling interval $\tau_k$ is $1/16$ of that of the sound source signal r[i] or 29 when the sampling interval $\tau_k$ is $15/64$ of that of the sound source signal r[i].

The quantizer 1 associates the signal range (full scale) of the input signal with the signal range (full scale) of the output signal. The signal range of the input signal is constant, whereas the signal range of the output signal varies depending on the sampling interval $\tau_k$. Thus, the conversion gain of the quantizer 1 needs to be in proportion to the sampling interval $\tau_k$. This is expressed by y[k]=round (g*s[k]*$\tau_k$). Here, g is the appropriate constant, and s[k] is the input signal to the quantizer 1. Furthermore, round( ) is the function that performs conversion into the integer closest to the argument.

The pulse width modulator 2 generates the PWM signal according to the PCM signal y[k]. In this case, the period of the carrier signal is equal to the sampling interval $\tau_k$ and varies dynamically. The generated PWM signal drives the switching amplifier 5. The switching amplifier 5 thus drives the speaker, which is a load, through the low-pass filter 6.

Several spectra of the PWM signal w(t) in the fully digital audio amplifier are shown in the figures. FIG. 12 shows an example of a spectrum of the PWM signal w(t) in the vicinity of the audible frequency region; the sound source signal is a sinusoidal wave with an amplitude of a modulation factor of 80% and a frequency of 2.7563 kHz. Although an insignificant second harmonic is observed, the spectrum shows that quantization noise in the audible frequency region is suppressed. Compared to the case in which the sampling period of the signal u[k] is constant, the present example slightly raises the noise floor in the audible frequency region because of the adverse effect of the interpolation error in the signal u[k] in the noise-shaping filter. However, the raise is more suppressed by virtue of the 1st-order interpolation compared to FIG. 9, where the 0th-order interpolation is used. FIG. 13 shows a broad spectrum of the PWM signal w(t). The figure indicates that the spectrum is spread by the dynamic variation in the carrier frequency of the PWM signal. Although the total amount of spectrum does not change significantly, the concentration of the spectrum at a particular frequency can be avoided. This allows the electromagnetic noise to be prevented.

FIG. 14 shows a spectrum of the PWM signal w(t) in the vicinity of the audible frequency region; the sound source signal is a sinusoidal wave with an amplitude of a modulation factor of 80% and a frequency of 16.5378 kHz. The spectrum shows that the increased frequency of the sound source signal increases the floor noise in the audible frequency region. This is due to the adverse effect of the interpolation error in the signal u[k] in the noise-shaping filter. The floor noise has almost the same magnitude as that observed with the 0th-order interpolation.

An advantage of the present example is that compared to the use of the 0th-order interpolation, the use of the concept of the 1st-order interpolation for the calculations for the noise-shaping filter reduces the floor noise caused by the interpolation error without significantly increasing the amount of calculations when the sound source signal has a low frequency.

Third Example

The present example corresponds to a fully digital audio amplifier that uses a PWM signal with a dynamically varying carrier period. The configuration of the audio amplifier is as shown in FIG. 2. The sound source signal r[i] is a PCM signal with a sampling frequency of 44.1 kHz and is input to the over sampler 4. The over sampler 4 converts the sound source signal r[i] into the PCM signal u[k] with the sampling interval $\tau_k$. The value of the sampling interval $\tau_k$ is not constant and is $1/16$ (about 1.472 μs) or $15/64$ (about 1.329 μs) of that of the sound source signal r[i]. The percentage at which the sampling interval $\tau_k$ of the PCM signal u[k] exhibits the $1/16$ value is almost the same as that at which the sampling interval $\tau_k$ of the PCM signal u[k] exhibits the $15/64$ value. Which of the values the sampling interval $\tau_k$ of the PCM signal u[k] exhibits is determined by a pseudo-random number. The noise-shaping filter 3 performs the filter calculations based on the concept of the 2nd-order interpolation and shown in Equations 10 to 13. The spectrum of the quantization noise in the PCM signal y[k], which is the output signal from the quantizer 1, is thus shaped to suppress the audible frequency components. The number of quantization steps in the quantizer 1 is 31 when the sampling interval $\tau_k$ is $\frac{1}{16}$ of that of the sound source signal r[i] or 29 when the sampling interval $\tau_k$ is $\frac{15}{64}$ of that of the sound source signal r[i].

The quantizer 1 associates the signal range (full scale) of the input signal with the signal range (full scale) of the output signal. The signal range of the input signal is constant, whereas the signal range of the output signal varies depending on the sampling interval $\tau_k$. Thus, the conversion gain of the quantizer 1 needs to be in proportion to the sampling interval $\tau_k$. This is expressed by y[k]=round (g*s[k]*$\tau_k$). Here, g is an appropriate constant, and s[k] is the input signal to the quantizer 1. Furthermore, round( ) is the function that performs conversion into the integer closest to the argument.

The pulse width modulator 2 generates the PWM signal according to the PCM signal y[k]. In this case, the period of the carrier signal is equal to the sampling interval $\tau_k$ and varies dynamically. The generated PWM signal drives the switching amplifier 5. The switching amplifier 5 thus drives the speaker, which is a load, through the low-pass filter 6.

Several spectra of the PWM signal w(t) in the fully digital audio amplifier are shown in the figures. FIG. 15 shows an example of a spectrum of the PWM signal w(t) in the vicinity of the audible frequency region; the sound source signal is a sinusoidal wave with an amplitude of a modulation factor of 80% and a frequency of 2.7563 kHz. The spectrum shows that the second harmonic is successfully suppressed and that the quantization noise in the audible frequency region is also suppressed. The adverse effect of the interpolation error in the signal u[k] in the noise-shaping filter is insignificant enough to be hidden by the quantization error. FIG. 16 shows a broad spectrum of the PWM signal w(t). The figure indicates that the spectrum is spread by the dynamic variation in the carrier frequency of the PWM signal. Although the total amount of spectrum does not change significantly, the concentration of the spectrum at a particular frequency can be avoided. This allows the electromagnetic noise interferences to be prevented.

FIG. 17 shows a spectrum of the PWM signal w(t) in the vicinity of the audible frequency region; the sound source signal is a sinusoidal wave with an amplitude of a modulation factor of 80% and a frequency of 16.5378 kHz. The spectrum shows that the increased frequency of the sound source signal increases the floor noise in the audible frequency region. This is due to the adverse effect of the interpolation error in the signal u[k] in the noise-shaping filter. The floor noise has almost the same magnitude as that observed with the 0th-order interpolation.

An advantage of the present example is that compared to the use of the 1st-order interpolation, the use of the concept of the 2nd-order interpolation for the calculations for the noise-shaping filter reduces the floor noise caused by the interpolation error without significantly increasing the amount of calculations when the sound source signal has a low frequency.

Fourth Example

The present example corresponds to a fully digital audio amplifier that uses a PWM signal with a dynamically varying carrier period. The configuration of the audio amplifier is similar to that shown in FIG. 2 except that the over sampler 4 outputs not only the PCM signal u[k] but also the $u_c$[k] and that the $u_c$[k] is additionally input to the noise-shaping filter 3. The sound source signal r[i] is a PCM signal with a sampling frequency of 44.1 kHz and is input to the over sampler 4. The over sampler 4 converts the sound source signal r[i] into the PCM signal u[k] with the sampling interval $\tau_k$. The value of the sampling interval $\tau_k$ is not constant and is $\frac{1}{16}$ (about 1.472 μs) or $\frac{15}{64}$ (about 1.329 μs) of that of the sound source signal r[i]. The percentage at which the sampling interval $\tau_k$ of the PCM signal u[k] exhibits the $\frac{1}{16}$ value is almost the same as that at which the sampling interval $\tau_k$ of the PCM signal u[k] exhibits the $\frac{15}{64}$ value. Which of the values the sampling interval $\tau_k$ of the PCM signal u[k] exhibits is determined by a pseudo-random number. The noise-shaping filter 3 performs the filter calculations based on the concept of the 2nd-order interpolation and shown in Equations 15 and 16. The spectrum of the quantization noise in the PCM signal y[k], which is the output signal from the quantizer 1, is thus shaped to suppress the audible frequency components. The number of quantization steps in the quantizer 1 is 31 when the sampling interval $\tau_k$ is $\frac{1}{16}$ of that of the sound source signal r[i] or 29 when the sampling interval $\tau_k$ is $\frac{15}{64}$ of that of the sound source signal r[i].

The quantizer 1 associates the signal range (full scale) of the input signal with the signal range (full scale) of the output signal. The signal range of the input signal is constant, whereas the signal range of the output signal varies depending on the sampling interval $\tau_k$. Thus, the conversion gain of the quantizer 1 needs to be in proportion to the sampling interval $\tau_k$. This is expressed by y[k]=round (g*s[k]*$\tau_k$). Here, g is the appropriate constant, and s[k] is the input signal to the quantizer 1. Furthermore, round( ) is the function that performs conversion into the integer closest to the argument.

The pulse width modulator 2 generates the PWM signal according to the PCM signal y[k]. In this case, the period of the carrier signal is equal to the sampling interval $\tau_k$ and varies dynamically. The generated PWM signal drives the switching amplifier 5. The switching amplifier 5 thus drives the speaker, which is a load, through the low-pass filter 6.

Several spectra of the PWM signal w(t) in the fully digital audio amplifier are shown in the figures. FIG. 18 shows an example of a spectrum of the PWM signal w(t) in the vicinity of the audible frequency region; the sound source signal is a sinusoidal wave with an amplitude of a modulation factor of 80% and a frequency of 2.7563 kHz. The spectrum shows that the second harmonic is successfully suppressed and that the quantization noise in the audible frequency region is also suppressed. The adverse effect of the interpolation error in the signal u[k] in the noise-shaping filter is insignificant enough to be hidden by the quantization error. FIG. 19 shows a broad spectrum of the PWM signal w(t). The figure indicates that the spectrum is spread by the dynamic variation in the carrier frequency of the PWM signal. Although the total amount of spectrum does not change significantly, the concentration of the spectrum at a particular frequency can be avoided. This allows the electromagnetic noise interferences to be prevented.

FIG. 20 shows a spectrum of the PWM signal w(t) in the vicinity of the audible frequency region; the sound source signal is a sinusoidal wave with an amplitude of a modulation factor of 80% and a frequency of 16.5378 kHz. The spectrum shows that the floor noise in the audible frequency region is prevented from being increased in spite of the increased frequency of the sound source signal. This is due to the use of the value $u_c$[k] between the sample points for the interpolation of the signal u[k] in the noise-shaping filter, which reduces the interpolation error.

An advantage of the present example is that the floor noise caused by the interpolation error can be reduced by using the value between the sample points for the calculations in the noise-shaping filter and also using the concept of the 2nd-order interpolation.

Fifth Example

The present example corresponds to a fully digital audio amplifier that uses a PWM signal with a dynamically varying carrier period. The configuration of the audio amplifier is as shown in FIG. 7. The sound source signal r[i] is a PCM signal with a sampling frequency of 44.1 kHz and is input to the over sampler 4. The over sampler 4 converts the sound source signal r[i] into the PCM signal u[h] with a sampling frequency of 705.6 kHz, which is 16 times as high as the sampling frequency of the sound source signal r[i]. The noise-shaping filter 3 and the quantizer 1 output the PCM signal y[k] with the sampling interval $\tau_k$. The value of the sampling interval $\tau_k$ is not constant and is $1/16$ (about 1.472 μs) or $13/16$ (about 1.152 μs) of that of the PCM signal u[h]. The rate at which the sampling interval $\tau_k$ of the PCM signal u[h] exhibits the $1/16$ value is almost the same as that at which the sampling interval $\tau_k$ of the PCM signal u[h] exhibits the $13/16$ value. Which of the values the sampling interval $\tau_k$ of the PCM signal u[h] exhibits is determined by a pseudo-random number. The noise-shaping filter 3 performs the filter calculations based on the concept of the 0th-order interpolation and shown in Equations 17 to 22. The frequency of the quantization noise in the PCM signal y[k], which is the output signal from the quantizer 1, is thus shaped to suppress the audible frequency components. The number of quantization steps in the quantizer 1 is 31 when the sampling interval $\tau_k$ is $1/16$ of that of the sound source signal r[i] or 25 when the sampling interval $\tau_k$ is $13/64$ of that of the sound source signal r[i].

The quantizer 1 associates the signal range (full scale) of the input signal with the signal range (full scale) of the output signal. The signal range of the input signal is constant, whereas the signal range of the output signal varies depending on the sampling interval $\tau_k$. Thus, the conversion gain of the quantizer 1 needs to be in proportion to the sampling interval $\tau_k$. This is expressed by y[k]=round (g*s[k]*$\tau_k$). Here, g is the appropriate constant, and s[k] is the input signal to the quantizer 1. Furthermore, round( ) is the function that performs conversion into the integer closest to the argument.

The pulse width modulator 2 generates the PWM signal according to the PCM signal y[k]. In this case, the period of the carrier signal is equal to the sampling interval $\tau_k$ and varies dynamically. The generated PWM signal drives the switching amplifier 5. The switching amplifier 5 thus drives the speaker, which is a load, through the low-pass filter 6.

Several spectra of the PWM signal w(t) in the fully digital audio amplifier are shown in the figures. FIG. 21 shows an example of a spectrum of the PWM signal w(t) in the vicinity of the audible frequency region; the sound source signal is a sinusoidal wave with an amplitude of a modulation factor of 80% and a frequency of 2.7563 kHz. The spectrum shows that the second harmonic is successfully suppressed and that the quantization noise in the audible frequency region is also suppressed. The constant sampling period of the PCM signal u[h] prevents the floor noise caused by the adverse effect of the interpolation error. FIG. 22 shows a broad spectrum of the PWM signal w(t). The figure indicates that the spectrum is spread by the dynamic variation in the carrier frequency of the PWM signal. Although the total amount of spectrum does not change significantly, the concentration of the spectrum at a particular frequency can be avoided. This allows the electromagnetic noise interferences to be prevented. In this case, the carrier frequency is allowed to vary significantly to more widely spread the spectrum.

FIG. 23 shows a spectrum of the PWM signal w(t) in the vicinity of the audible frequency region; the sound source signal is a sinusoidal wave with an amplitude of a modulation factor of 80% and a frequency of 16.5378 kHz. The spectrum shows that the floor noise increase in the audible frequency region is prevented in spite of the increased frequency of the sound source signal.

An advantage of the present example is that the constant sampling period of the PCM signal u[h] prevents the floor noise caused by the interpolation error in PCM signal u[h].

Another advantage of the present example is that the sampling interval of the PCM signal y[k], that is, the range of variation in the carrier period of the PWM signal w(t), can be increased to allow the spectrum of the PWM signal to be sufficiently spread.

In the present example, the noise-shaping filter 3 has performed the filter calculations shown in Equations 17 to 22, for each sampling period of the PCM signal y[k]. However, the filter calculations shown in Equations 23 to 27 may be performed for each sampling period of the u[h].

DESCRIPTION OF SYMBOLS

Figure 1:
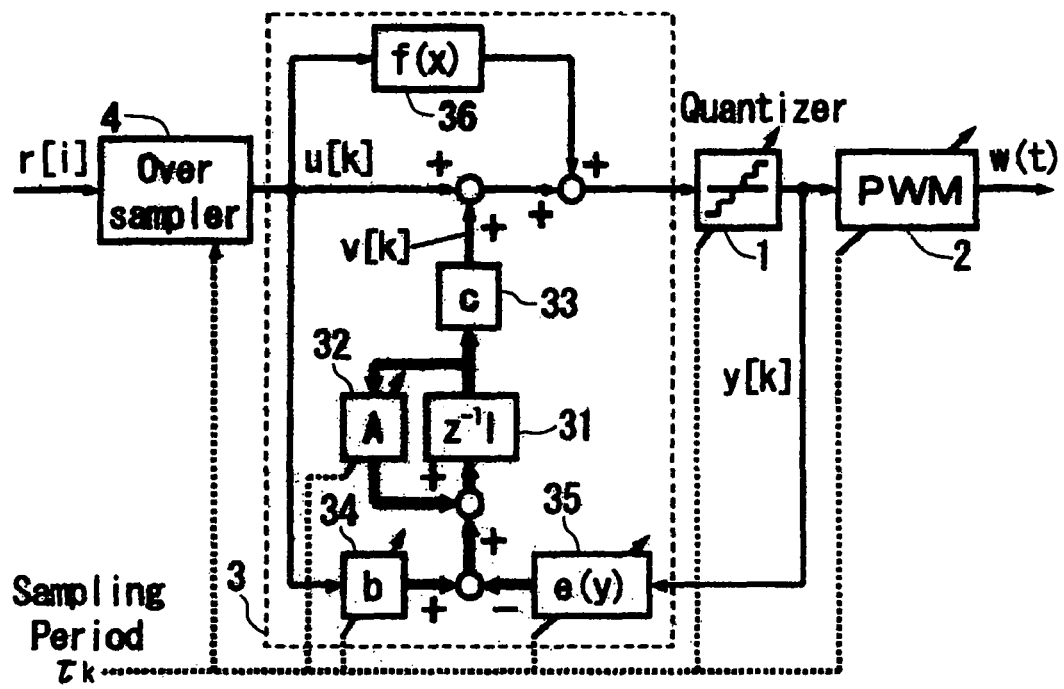
FIG. 1 is a block diagram showing a configuration of a noise-shaping filter.
Figure 2:
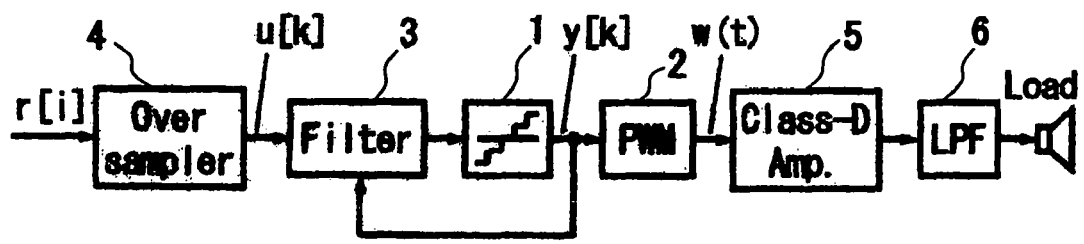
FIG. 2 is a block diagram showing a configuration of a fully digital amplifier.
Figure 3:
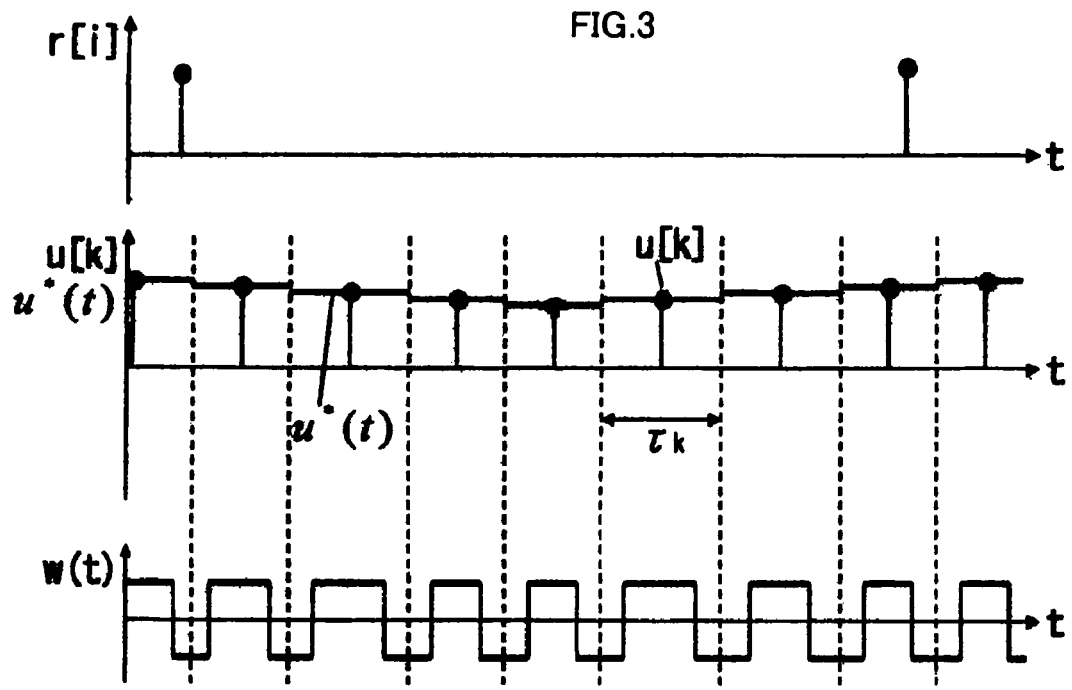
FIG. 3 is a diagram showing a relationship between variable sampling signals observed in the case that a 0th-order hold is used according to a first embodiment of the present invention.
Figure 4:
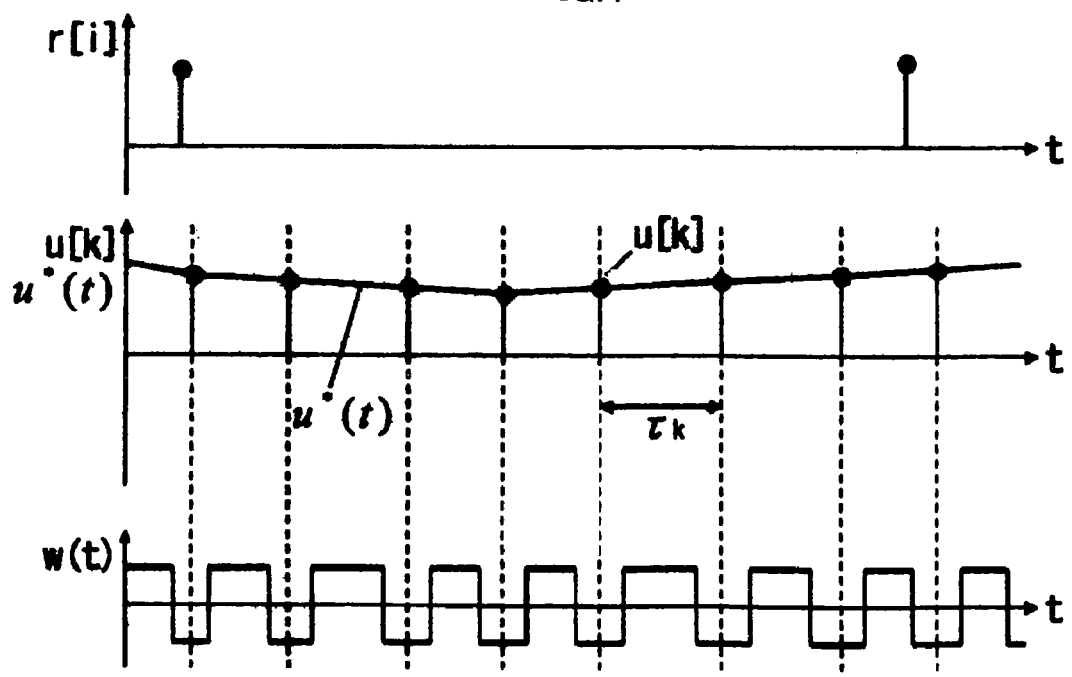
FIG. 4 is a diagram showing a relationship between variable sampling signals observed in the case that 1st-order approximation is used according to the first embodiment of the present invention.
Figure 5:
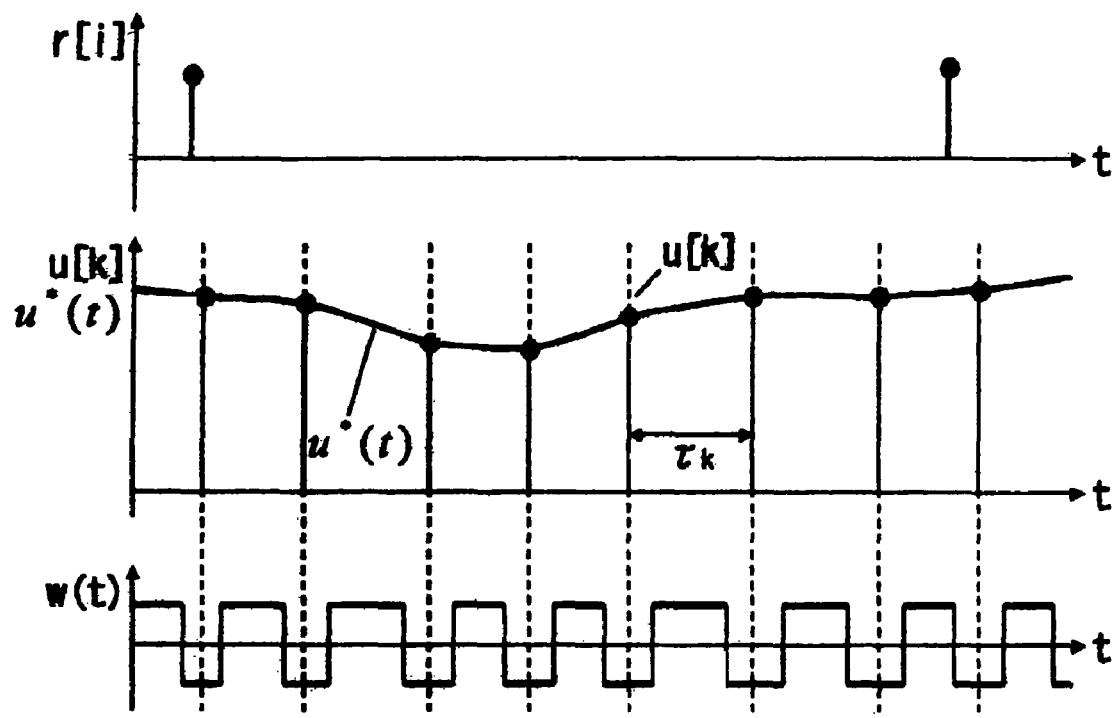
FIG. 5 is a diagram showing the relationship between the variable sampling signals observed in the case that 2nd-order approximation is used according to the first embodiment of the present invention.
Figure 6:
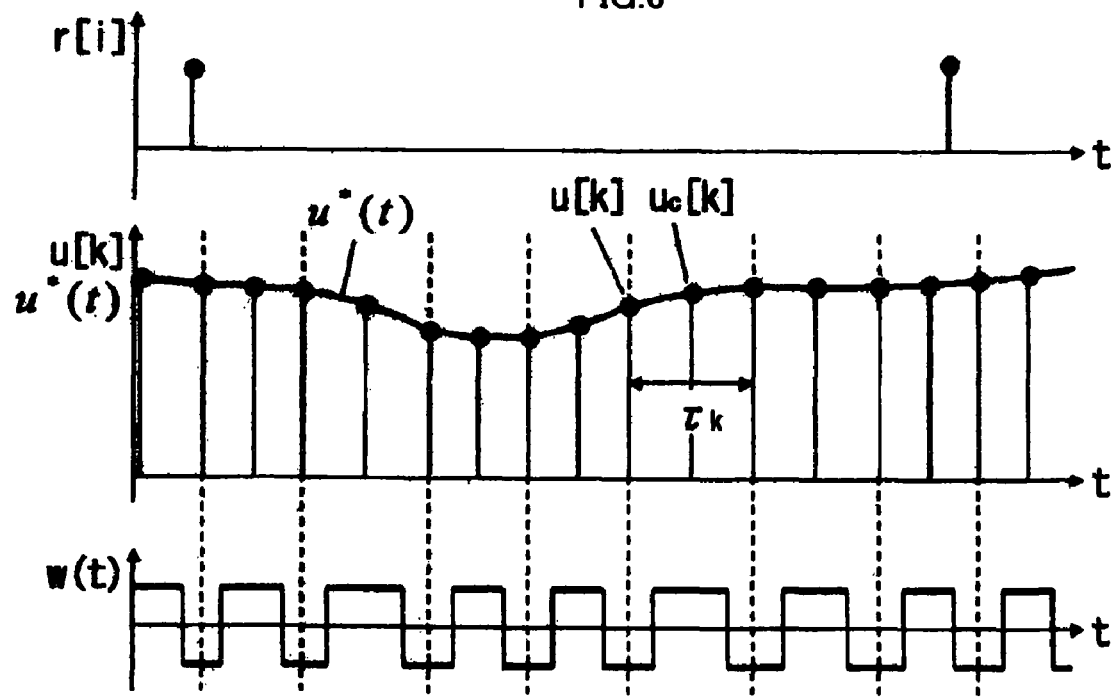
FIG. 6 is a diagram showing the relationship between the variable sampling signals observed in the case that 2nd-order interpolation is used according to a second embodiment of the present invention.
Figure 7:
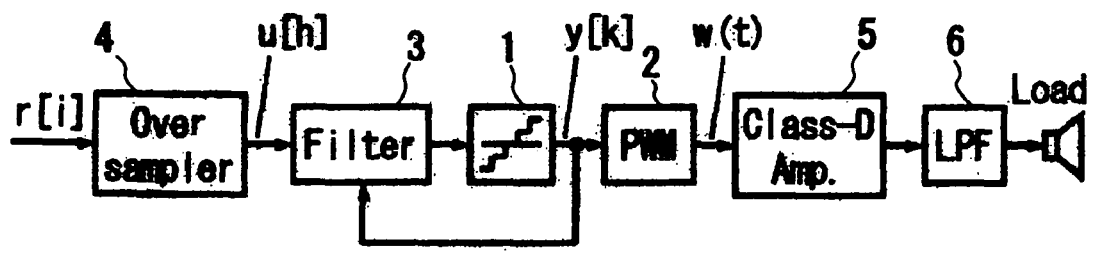
FIG. 7 is a block diagram showing a configuration of a fully digital amplifier according to a third embodiment of the present invention.
Figure 8:
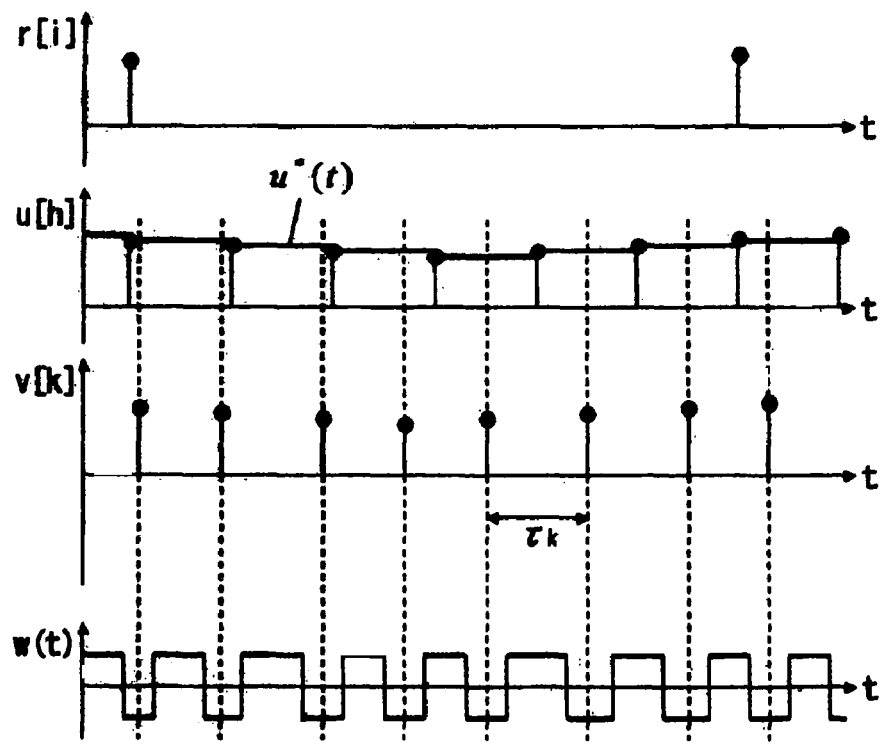
FIG. 8 is a diagram showing the relationship between the variable sampling signals observed in the case that the 0th-order hold is used according to the third embodiment of the present invention.
Figure 9:
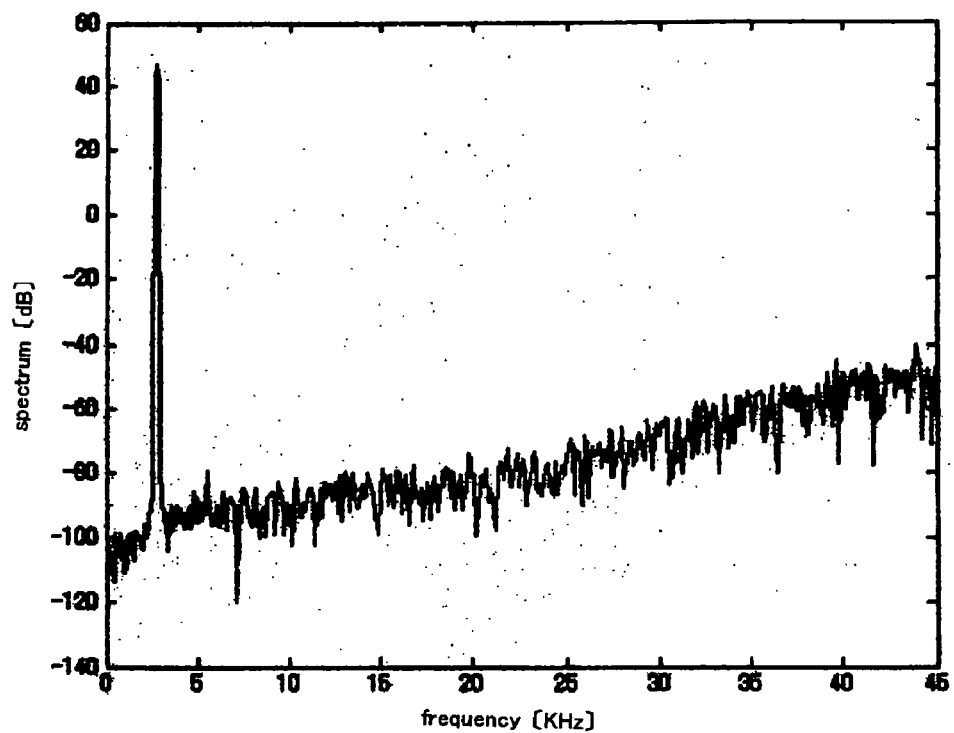
FIG. 9 is a diagram of a spectrum of a pulse width modulated signal in the vicinity of an audible frequency region according to a first example of the present invention.
Figure 10:
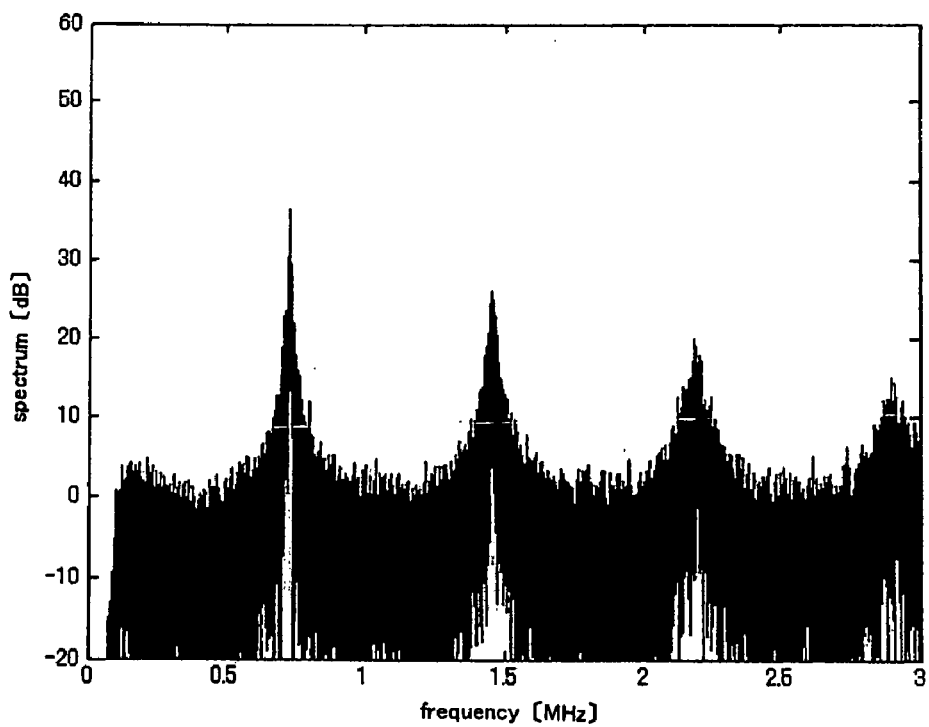
FIG. 10 is a diagram of a broad spectrum of the pulse width modulated signal in the first example of the present invention.
Figure 11:
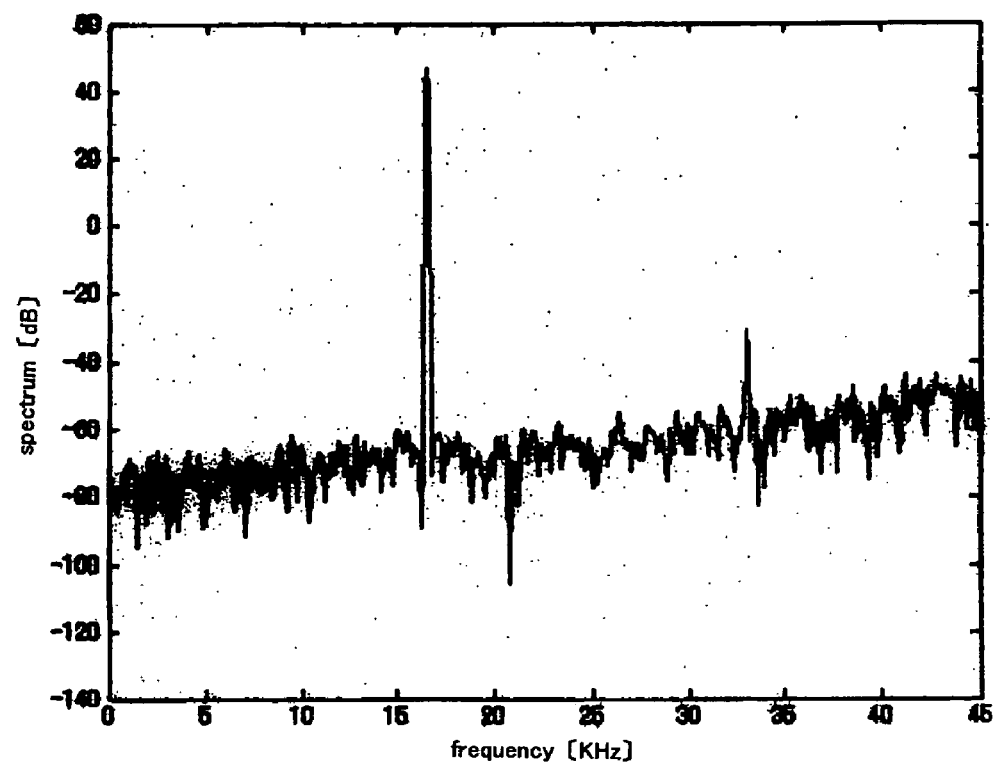
FIG. 11 is a diagram of a spectrum of a pulse width modulated signal in the vicinity of the audible frequency region with respect to a sound source signal with a high frequency in the first example of the present invention.
Figure 12:
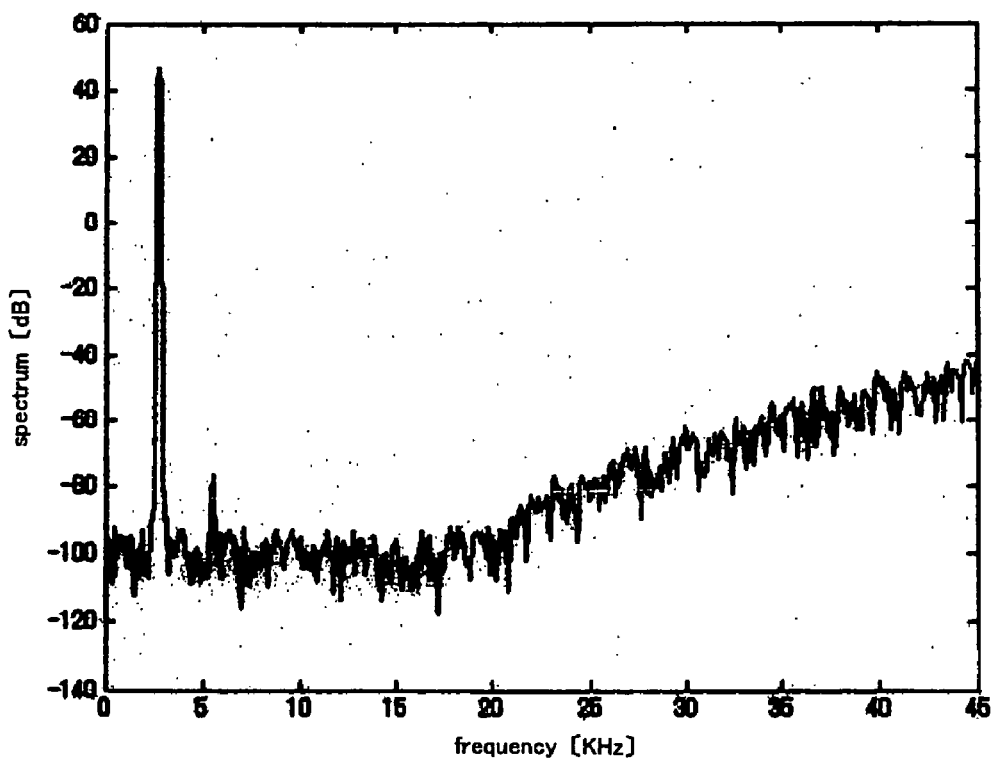
FIG. 12 is a diagram of a spectrum of a pulse width modulated signal in the vicinity of the audible frequency region according to a second example of the present invention.
Figure 13:
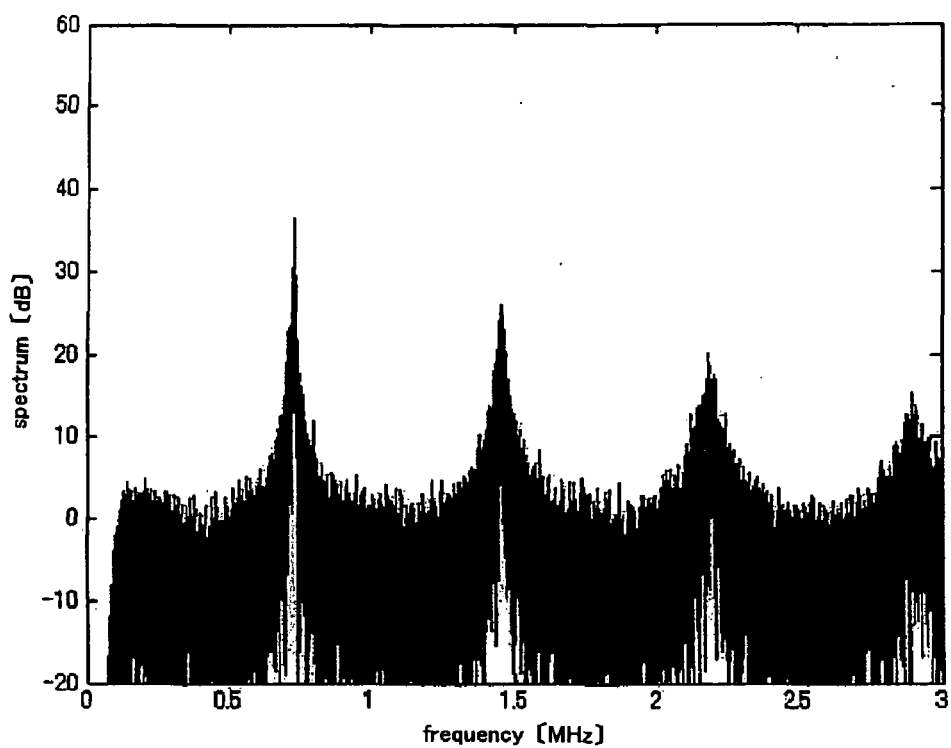
FIG. 13 is a diagram of a broad spectrum of the pulse width modulated signal in the second example of the present invention.
Figure 14:
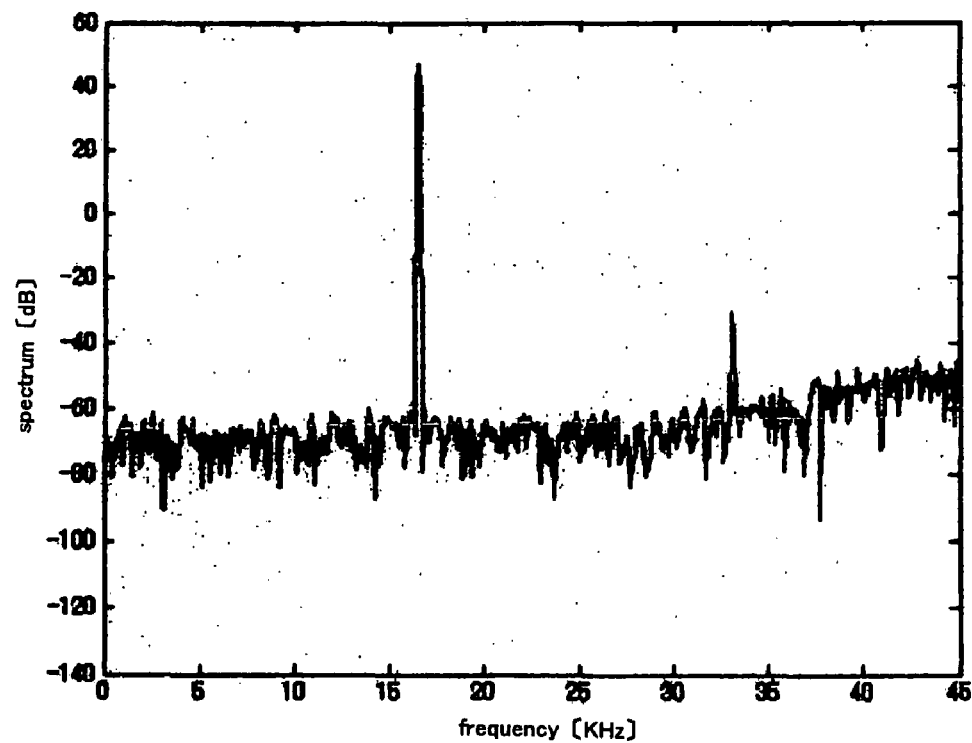
FIG. 14 is a diagram of a spectrum of a pulse width modulated signal in the vicinity of the audible frequency region with respect to a sound source signal with a high frequency in the second example of the present invention.
Figure 15:
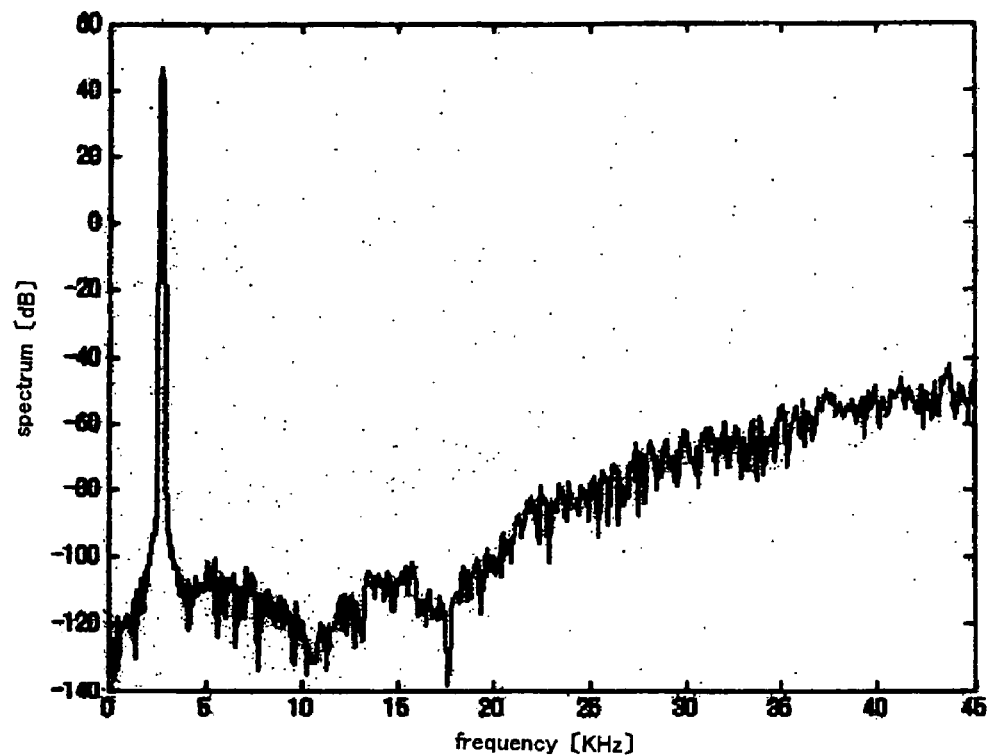
FIG. 15 is a diagram of a spectrum of a pulse width modulated signal in the vicinity of the audible frequency region according to a third example of the present invention.
Figure 16:
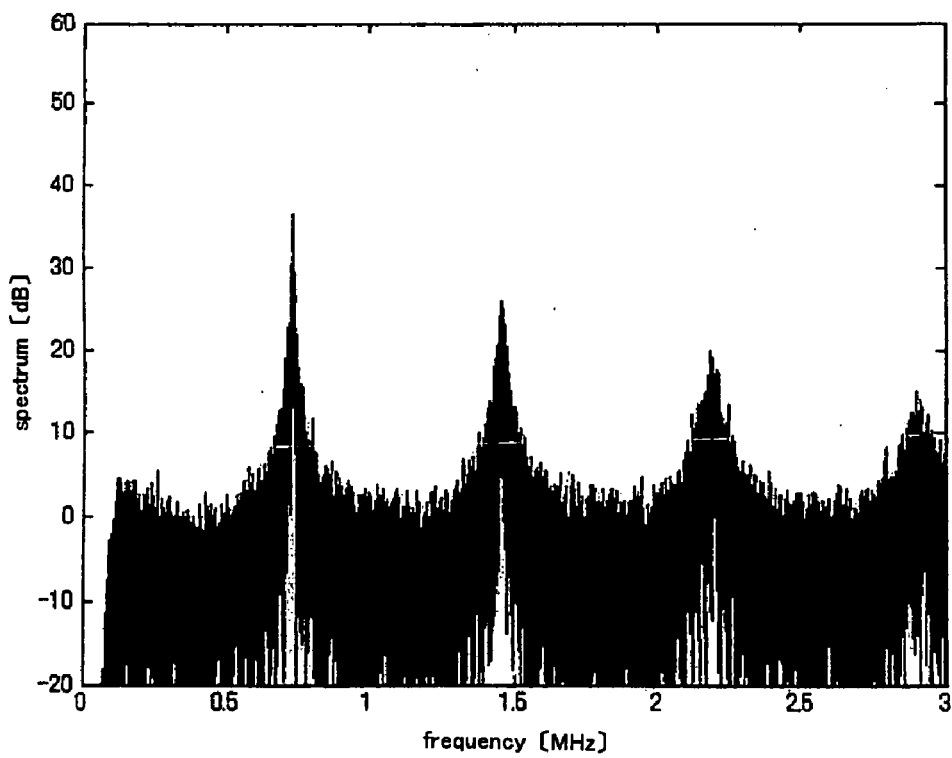
FIG. 16 is a diagram of a broad spectrum of the pulse width modulated signal in the third example of the present invention.
Figure 17:
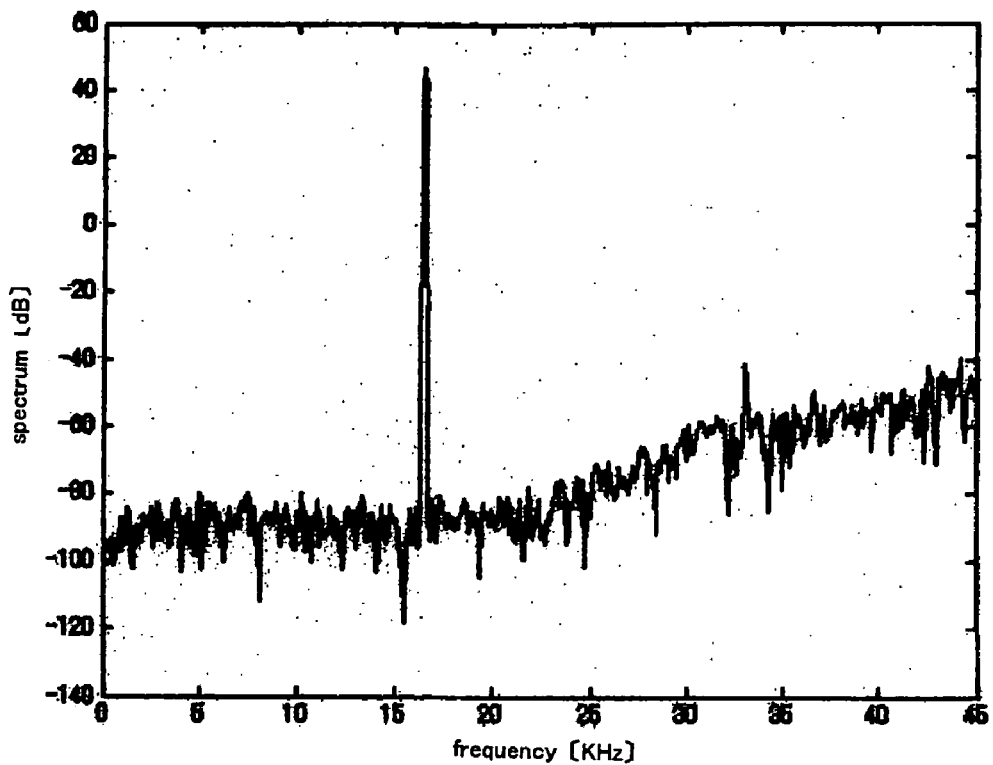
FIG. 17 is a diagram of a spectrum of a pulse width modulated signal in the vicinity of the audible frequency region with respect to a sound source signal with a high frequency in the third example of the present invention.
Figure 18:
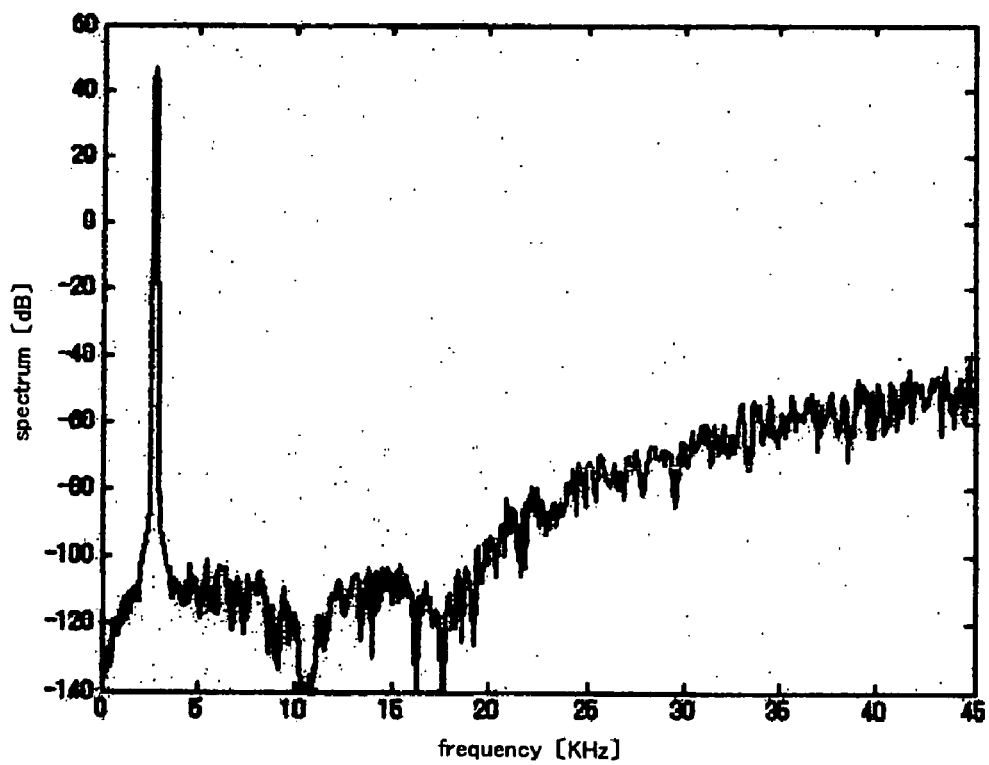
FIG. 18 is a diagram of a spectrum of a pulse width modulated signal in the vicinity of the audible frequency region according to a fourth example of the present invention.
Figure 19:
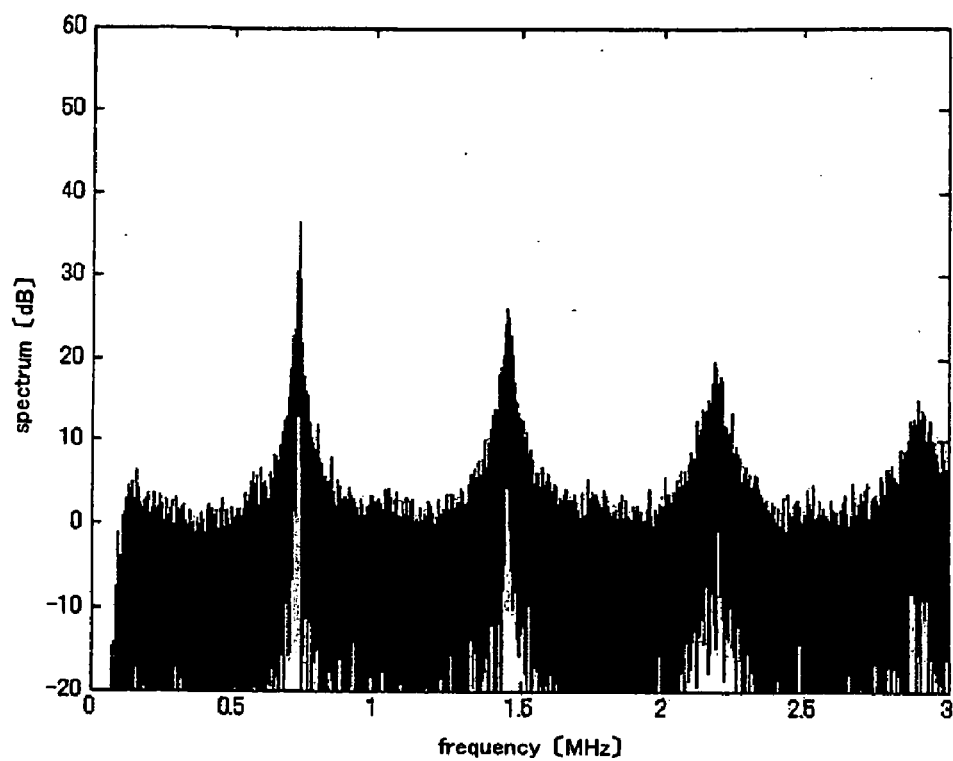
FIG. 19 is a diagram of a broad spectrum of the pulse width modulated signal in the fourth example of the present invention.
Figure 20:
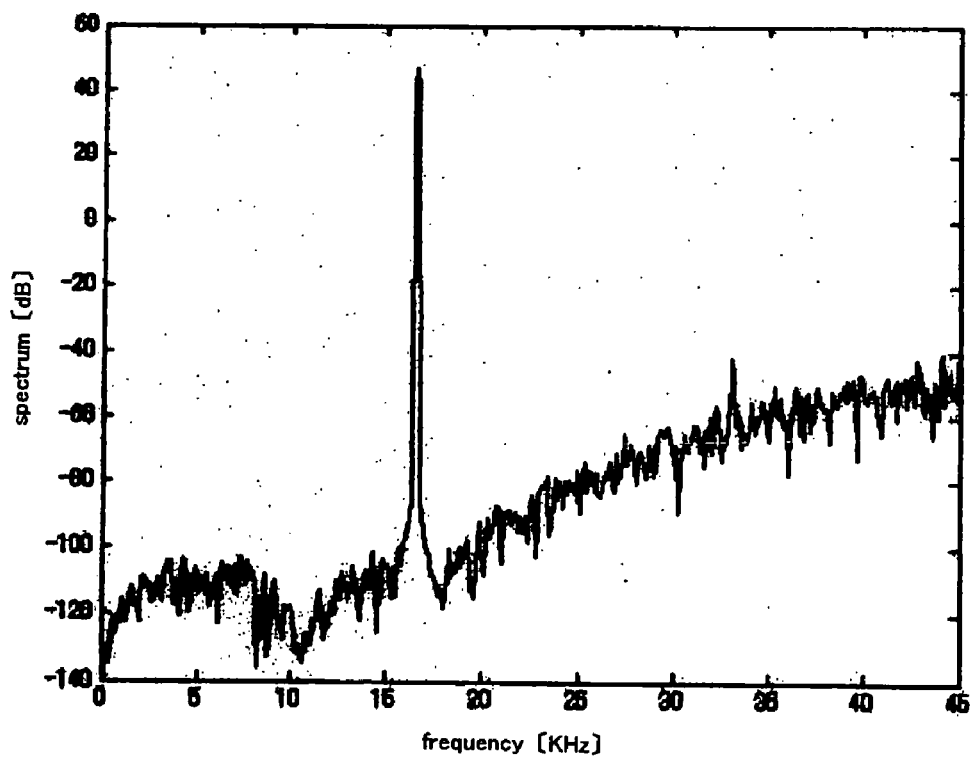
FIG. 20 is a diagram of a spectrum of a pulse width modulated signal in the vicinity of the audible frequency region with respect to a sound source signal with a high frequency in the fourth example of the present invention.
Figure 21:
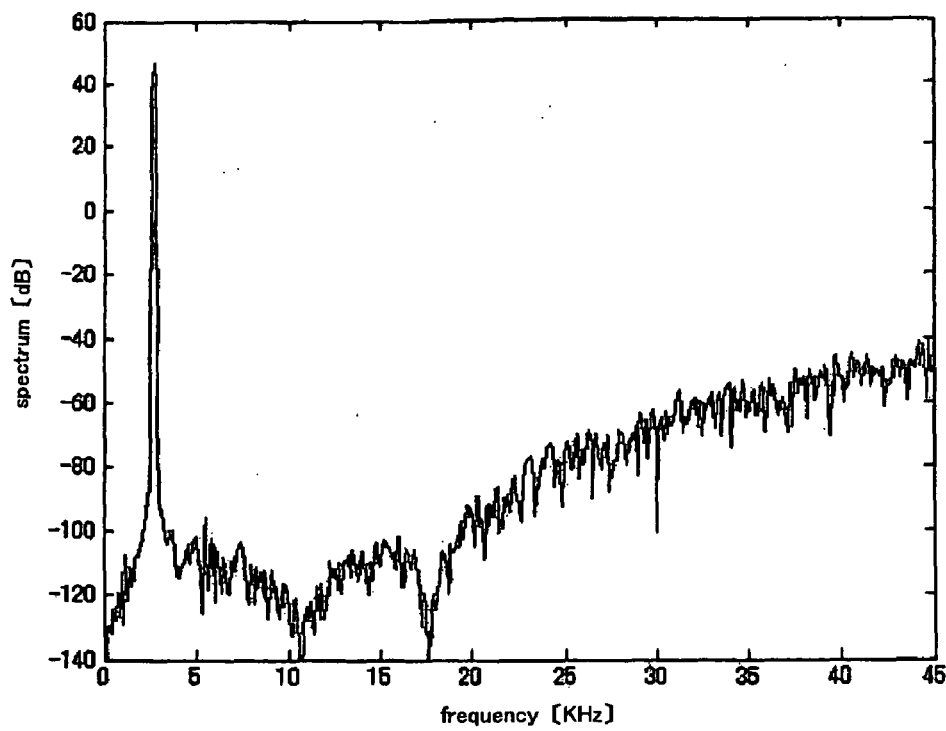
FIG. 21 is a diagram of a spectrum of a pulse width modulated signal in the vicinity of the audible frequency region according to a fifth example of the present invention.
Figure 22:
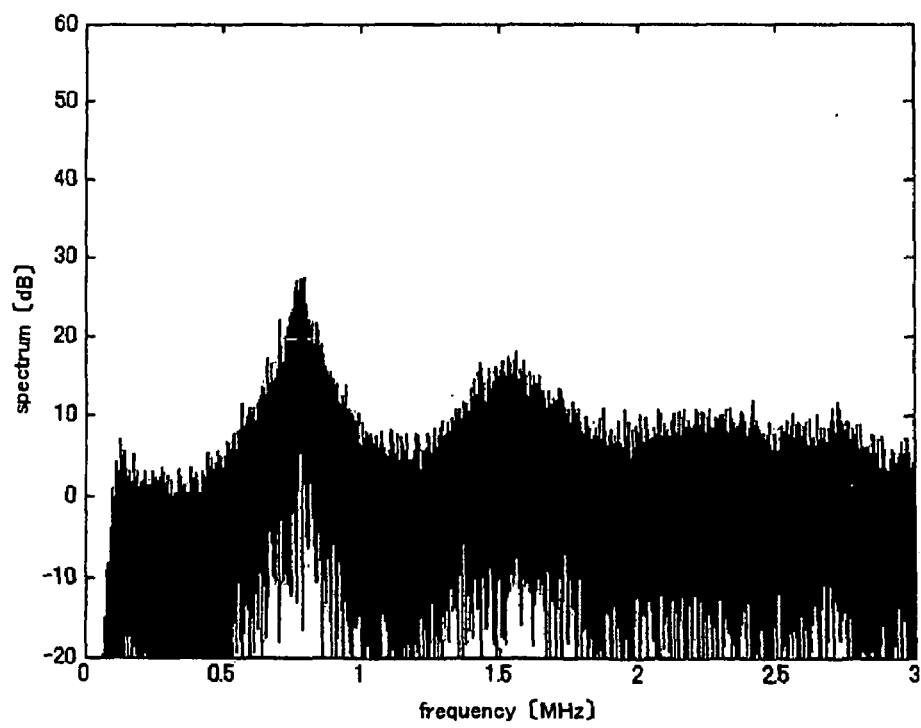
FIG. 22 is a diagram of a broad spectrum of the pulse width modulated signal in the fifth example of the present invention.
Figure 23:
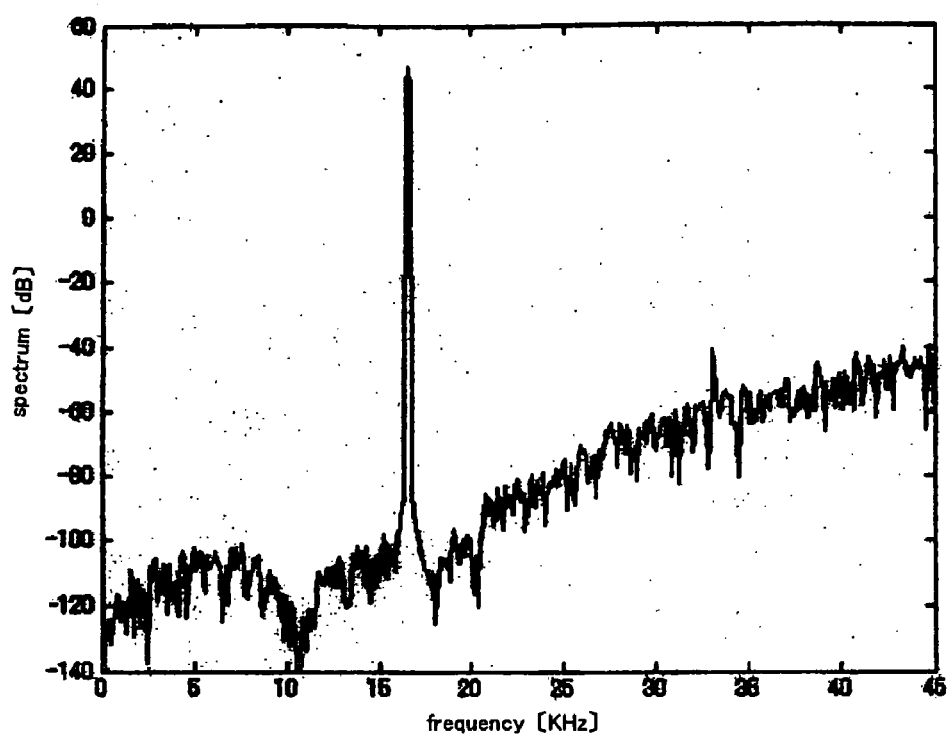
FIG. 23 is a diagram of a spectrum of a pulse width modulated signal in the vicinity of the audible frequency region with respect to a sound source signal with a high frequency in the fifth example of the present invention.
Figure 24:
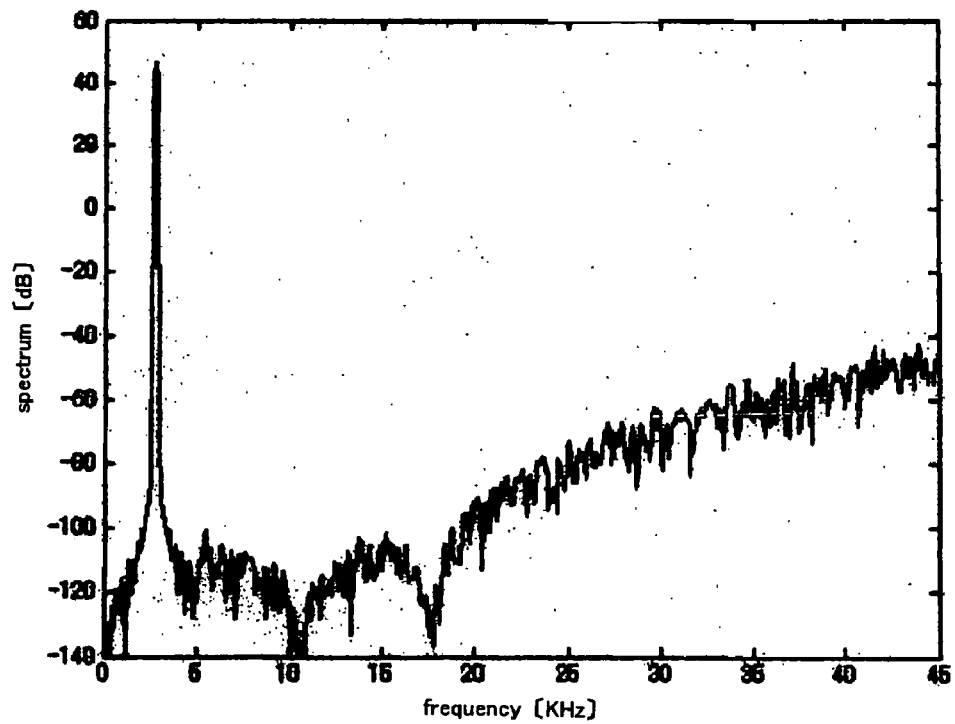
FIG. 24 is a diagram of a spectrum, in the vicinity of the audible frequency region, of a pulse width modulated signal generated according to the conventional art.
Figure 25:
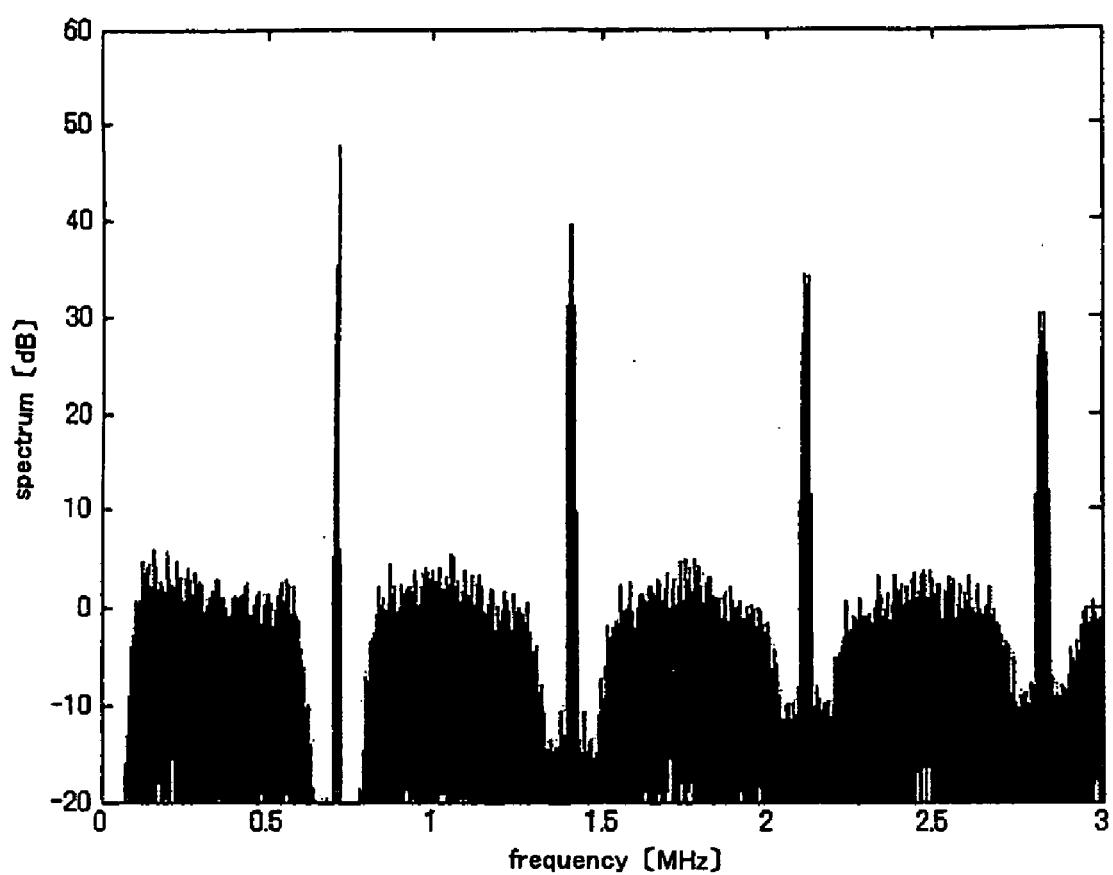
FIG. 25 is a diagram of a broad spectrum of a pulse width modulated signal generated according to the conventional art.

1 Quantizer
2 Pulse width modulator
3 Noise-shaping filter
31 Delay element
32 Square matrix
33 Output vector
34 Input vector
35 Nonlinear function vector
36 Nonlinear element
4 Over sampler
5 Switching amplifier
6 Low-pass filter

What is claimed is:

1. A PWM signal generator comprising:
a first PCM signal that is input into the PWM signal generator, the first PCM signal having a first sampling period;
a second PCM signal having a second sampling period, wherein
the second sampling period is varied for each sampling period so that the same period may consecutively appear, according to an external instruction or a predetermined sequence, and a resolution of the second PCM signal is coarser than that of the first PCM signal;
a delta-sigma modulator that converts the first PCM signal into the second PCM signal, the delta-sigma modulator including a filter and a quantizer, wherein
the first PCM signal and the second PCM signal are input into the filter, which then outputs a third PCM signal, and
the quantizer converts the third PCM signal into the second PCM signal and a gain of the quantizer is dynamically varied in proportion to a value of the second sampling period, and a set of coefficients and a set of functions for an internal calculation in the filter are determined and dynamically varied according to the second sampling period; and
a PWM signal that is output from the PWM signal generator, wherein
the PWM signal is generated by digital means based on the second PCM signal.

2. The PWM signal generator of claim 1, further comprising:
a fourth PCM signal that is input into the PWM signal generator; and
an over sampler to which the fourth PCM signal is input and which outputs the first PCM signal, wherein
a low frequency component of the PWM signal depends on the fourth PCM signal, and the fourth PCM signal has a third sampling period that is constant, the third sampling period being longer than the first sampling period.

3. A digital amplifier comprising:
a switching amplifier; and
the PWM signal generator of claim 2, wherein
the PWM signal generated by the PWM signal generator drives the switching amplifier.

4. A PWM signal generator comprising:
a first PCM signal that is input into the PWM signal generator, the first PCM signal having a first sampling period;
a second PCM signal having a second sampling period, wherein
the second sampling period is varied for each sampling period so that the same period may consecutively appear, according to an external instruction or a predetermined sequence, the first sampling period being equal to the second sampling period, and a resolution of the second PCM signal is coarser than that of the first PCM signal;
a delta-sigma modulator that converts the first PCM signal into the second PCM signal, the delta-sigma modulator including a filter and a quantizer, wherein
the first PCM signal and the second PCM signal are input into the filter, which then outputs a third PCM signal, and
the quantizer converts the third PCM signal into the second PCM signal and a gain of the quantizer is dynamically varied in proportion to a value of the second sampling period, and a set of coefficients and a set of functions for an internal calculation in the filter are determined and dynamically varied according to the second sampling period; and
a PWM signal that is output from the PWM signal generator, wherein
the PWM signal is generated by digital means based on the second PCM signal.

5. The PWM signal generator of claim 4, further comprising:
a fourth PCM signal that is input into the PWM signal generator; and an over sampler that is part of the PWM signal generator, the fourth PCM signal being input to the over sampler, the over sampler outputting the first PCM signal, wherein a low frequency component of the PWM signal depends on the fourth PCM signal, and the fourth PCM signal has a third sampling period which is constant, the third sampling period being longer than the first sampling period.

6. A digital amplifier comprising:
a switching amplifier; and
the PWM signal generator of claim 5, wherein
the PWM signal generated by the PWM signal generator drives the switching amplifier.

7. A PWM signal generator comprising:
a first PCM signal that is input into the PWM signal generator, the first PCM signal having a first sampling period;
a second PCM signal having a second sampling period, wherein
the second sampling period is varied for each sampling period so that the same period may consecutively appear, according to an external instruction or a predetermined sequence, a sequence of instants for sampling of the first PCM signal is obtained by adding a sequence of instants between samplings of the second PCM signal to a sequence of instants for sampling of the second PCM signal, and a resolution of the second PCM signal is coarser than that of the first PCM signal;
a delta-sigma modulator that converts the first PCM signal into the second PCM signal, the delta-sigma modulator including a filter and a quantizer, wherein
the first PCM signal and the second PCM signal are input into the filter, which then outputs a third PCM signal, and
the quantizer converts the third PCM signal into the second PCM signal and a gain of the quantizer is dynamically varied in proportion to a value of the second sampling period, and a set of coefficients and a set of functions for an internal calculation in the filter are determined and dynamically varied according to the second sampling period; and
a PWM signal that is output from the PWM signal generator, wherein
the PWM signal is generated by digital means based on the second PCM signal.

8. The PWM signal generator of claim 7, further comprising:
a fourth PCM signal that is input into the PWM signal generator; and
an over sampler to which the fourth PCM signal is input and which outputs the first PCM signal, wherein
a low frequency component of the PWM signal depends on the fourth PCM signal, and the fourth PCM signal has a third sampling period that is constant, the third sampling period being longer than the first sampling period.

9. A digital amplifier comprising:
a switching amplifier; and
the PWM signal generator of claim 8, wherein
the PWM signal generated by the PWM signal generator drives the switching amplifier.

10. A PWM signal generator comprising:
a first PCM signal that is input into the PWM signal generator, the first PCM signal having a first sampling period that is constant;
a second PCM signal having a second sampling period, wherein
the second sampling period is varied for each sampling period so that the same period may consecutively appear, according to an external instruction or a predetermined sequence, and a resolution of the second PCM signal is coarser than that of the first PCM signal;
a delta-sigma modulator that converts the first PCM signal into the second PCM signal, the delta-sigma modulator including a filter and a quantizer, wherein
the first PCM signal and the second PCM signal are input into the filter, which then outputs a third PCM signal, and
the quantizer converts the third PCM signal into the second PCM signal and a gain of the quantizer is dynamically varied in proportion to a value of the second sampling period, and a set of coefficients and a set of functions for an internal calculation in the filter are determined and dynamically varied according to the second sampling period, or the second sampling period and a relative relationship between a timing for sampling of the first PCM signal and a timing for sampling of the second PCM signal; and
a PWM signal that is output from the PWM signal generator, wherein
the PWM signal is generated by digital means based on the second PCM signal.

11. The PWM signal generator of claim 10, further comprising:
a fourth PCM signal that is input into the PWM signal generator; and
an over sampler to which the fourth PCM signal is input and which outputs the first PCM signal, wherein
a low frequency component of the PWM signal depends on the fourth PCM signal, and the fourth PCM signal has a third sampling period that is constant, the third sampling period being longer than the first sampling period.

12. A digital amplifier comprising:
a switching amplifier; and
the PWM signal generator of claim 11, wherein
the PWM signal generated by the PWM signal generator drives the switching amplifier.

* * * * *